(12) United States Patent
Jeong et al.

(10) Patent No.: US 8,020,062 B2
(45) Date of Patent: Sep. 13, 2011

(54) APPARATUS AND METHOD OF ENCODING/DECODING BLOCK LOW DENSITY PARITY CHECK CODES IN A COMMUNICATION SYSTEM

(75) Inventors: Hong-Sil Jeong, Seoul (KR); Jae-Yoel Kim, Suwon-si (KR); Sung-Eun Park, Seoul (KR); Seung-Hoon Choi, Seoul (KR); Dong-Seek Park, Yongin-si (KR); Young-Ho Kim, Suwon-si (KR); Kyeong-Cheol Yang, Seoul (KR); Hyun-Koo Yang, Seoul (KR); Gyu-Bum Kyung, Suwon-si (KR); Se-Ho Myung, Daejeon (KR)

(73) Assignees: Samsung Electronics Co., Ltd. (KR); Postech Academy Industry Foundation (KR)

( * ) Notice: Subject to any disclaimer, the term of this patent is extended or adjusted under 35 U.S.C. 154(b) by 1124 days.

(21) Appl. No.: 11/763,888

(22) Filed: Jun. 15, 2007

(65) Prior Publication Data

US 2008/0028273 A1 Jan. 31, 2008

(30) Foreign Application Priority Data

Jun. 15, 2006 (KR) .................. 10-2006-0054105
Dec. 4, 2006 (KR) .................. 10-2006-0121824

(51) Int. Cl.
*H03M 13/00* (2006.01)

(52) U.S. Cl. .................. 714/752; 714/795; 714/801

(58) Field of Classification Search .................. 714/752, 714/801, 786, 755, 795, 758, 776, 804, 799
See application file for complete search history.

(56) References Cited

U.S. PATENT DOCUMENTS

| | | | |
|---|---|---|---|
| 7,779,331 B2 * | 8/2010 | Tan ................ | 714/758 |
| 7,801,200 B2 * | 9/2010 | Tan ................ | 375/146 |
| 7,802,163 B2 * | 9/2010 | Tan ................ | 714/752 |
| 2004/0098659 A1 | 5/2004 | Bjerke et al. | |
| 2005/0283709 A1 | 12/2005 | Kyung et al. | |

FOREIGN PATENT DOCUMENTS

| | | |
|---|---|---|
| EP | 1 385 270 | 1/2004 |
| EP | 1 460 766 | 9/2004 |
| EP | 1 511 177 | 3/2005 |
| EP | 1 596 501 | 4/2009 |
| WO | WO 2006/039801 | 4/2006 |
| WO | WO 2006/040805 | 4/2006 |

OTHER PUBLICATIONS

Jing Li et al., "Rate-Compatible Low Density Parity Check Codes for Capacity-Approaching ARQ Scemes in Packet Data Communications", Nov. 18, 2002.

Ajay Dholakia et al., "Rate-Compatible Low-Density Parity-Check Codes for Digital Subscriber Lines", Jun. 20, 2004.

* cited by examiner

*Primary Examiner* — Fritz Alphonse
(74) *Attorney, Agent, or Firm* — The Farrell Law Firm, P.C.

(57) ABSTRACT

An apparatus and method of encoding a block Low Density Parity Check (LDPC) code in a signal transmission apparatus is disclosed. The method includes generating a block LDPC codeword by encoding an information vector using a second parity check matrix when a code rate to be used in the signal transmission apparatus is a second code rate less than a code rate of a first parity check matrix as a first code rate.

36 Claims, 26 Drawing Sheets

|  s  | $p_1$ | $p_2$ | $p_3$ |
|---|---|---|---|
| A (111) | B (121) | T (131) | O (141) |
| C (113) | D (123) | E (133) | O (143) |
| F (115) | O (125) | O (135) | I (145) |

FIG.1

|    | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|----|---|---|---|---|---|---|---|---|---|---|----|----|----|----|----|----|----|----|----|----|----|----|----|----|----|----|----|----|----|----|----|----|
| 0  | 0 | 0 |   |   | 0 | 0 | 0 |   |   |   |    | 0  |    |    |    |    |    |    | 0  | 0  |    | 0  |    |    |    | 0  |    |    |    |    |    |    |
| 1  | 40|   |   | 0 | 0 | 24|   | 3 | 0 | 0 |    |    |    |    | 0  |    |    |    |    |    | 0  |    |    |    |    | 0  |    |    |    |    |    |    |
| 2  | 29| 16| 3 | 8 | 47| 9 |   |   | 0 |   | 34 |    |    |    |    |    |    |    |    |    |    |    | 0  |    |    |    |    |    |    |    |    | 0  |
| 3  |   | 26| 43| 45|   | 7 | 18|   |   | 0 |    |    |    |    | 0  |    |    |    |    | 5  |    | 14 |    |    |    |    |    |    |    |    | 0  |    |
| 4  | 48|   | 40| 37| 0 | 22|   |   |   |   | 0  | 0  | 41 |    |    |    |    |    |    |    |    |    | 4  | 0  |    |    |    |    |    |    |    |    |
| 5  | 13| 21| 32| 16|   | 16| 49|   |   |   | 17 |    |    |    |    |    |    |    | 0  |    |    |    |    |    |    | 0  |    | 0  |    |    |    |    |
| 6  |   | 18|   | 27| 44| 7 | 41|   |   |   |    | 21 |    |    | 0  |    |    |    |    |    | 43 |    |    | 3  |    |    |    |    | 48 |    |    |    |
| 7  | 22| 33| 24|   | 3 | 23|   |   | 4 |   |    |    |    |    | 0  |    |    |    |    | 0  |    |    |    |    |    |    | 29 |    |    | 26 |    |    |
| 8  | 41| 22| 5 |   | 13|   | 1 | 26|   |   |    | 38 |    |    |    | 47 |    |    |    |    |    |    |    |    |    |    |    |    | 39 |    |    |    |
| 9  |   | 36| 16| 1 |   | 8 | 45|   |   |   |    |    |    |    | 41 | 34 |    |    |    | 23 |    |    | 41 |    |    |    |    |    |    |    |    | 35 |
| 10 | 2 | 40|   | 36| 35| 19|   |   | 24| 42| 13 |    |    | 40 |    |    |    |    |    |    |    |    |    |    |    |    |    |    | 43 |    |    |    |
| 11 |   | 37| 11| 10| 47| 44| 8 | 15|   |   |    |    |    |    |    |    |    |    | 48 |    |    |    | 47 |    |    |    |    | 30 |    |    |    |    |
| 12 | 2 |   | 14|   | 32| 0 | 9 |   |   |   |    |    |    |    | 45 |    |    |    |    |    | 25 | 25 |    |    |    | 38 |    |    |    | 39 |    |    |
| 13 | 14| 12| 41| 19|   |   | 7 |   | 5 |   |    |    |    |    |    |    | 26 | 31 |    |    |    |    |    |    | 20 |    |    | 18 |    |    |    |    |
| 14 | 1 |   | 9 | 26| 16| 22| 28|   |   |   | 1  |    |    |    |    | 46 |    |    |    | 29 |    |    |    |    |    |    |    | 0  |    |    |    |    |

FIG.3A

|    | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|----|---|---|---|---|---|---|---|---|---|---|----|----|----|----|----|----|----|----|----|----|----|----|----|----|----|----|----|----|----|----|----|----|
| 15 | 9 | 34|   | 20| 18|   | 35|   |   |   |    |    |    |    |    |    | 45 |    |    |    | 48 |    |    | 4  |    |    | 26 |    |    |    |    | 2  |

|    | 33 | 34 | 35 | 36 | 37 | 38 | 39 | 40 | 41 | 42 | 43 | 44 | 45 | 46 | 47 |
|----|----|----|----|----|----|----|----|----|----|----|----|----|----|----|----|
| 0  | 0  |    |    |    |    |    |    |    |    |    |    |    |    |    |    |
| 1  | 0  | 0  |    |    |    |    |    |    |    |    |    |    |    |    |    |
| 2  |    | 0  | 0  |    |    |    |    |    |    |    |    |    |    |    |    |
| 3  |    |    | 0  | 0  |    |    |    |    |    |    |    |    |    |    |    |
| 4  |    |    |    | 0  | 0  |    |    |    |    |    |    |    |    |    |    |
| 5  |    |    |    |    | 0  | 0  |    |    |    |    |    |    |    |    |    |
| 6  |    |    |    |    |    | 0  | 0  |    |    |    |    |    |    |    |    |
| 7  |    |    |    |    |    |    | 0  | 0  |    |    |    |    |    |    |    |
| 8  |    |    |    |    |    |    |    | 0  | 0  |    |    |    |    |    |    |
| 9  |    |    |    |    |    |    |    |    | 0  | 0  |    |    |    |    |    |
| 10 |    |    |    |    |    |    |    |    |    | 0  | 0  |    |    |    |    |
| 11 |    |    |    |    |    |    |    |    |    |    | 0  | 0  |    |    |    |
| 12 |    |    |    |    |    |    |    |    |    |    |    | 0  | 0  |    |    |
| 13 |    |    |    |    |    |    |    |    |    |    |    |    | 0  | 0  |    |
| 14 |    |    |    |    |    |    |    |    |    |    |    |    |    | 0  | 0  |

FIG.3G

|    | 33 | 34 | 35 | 36 | 37 | 38 | 39 | 40 | 41 | 42 | 43 | 44 | 45 | 46 | 47 |
|----|----|----|----|----|----|----|----|----|----|----|----|----|----|----|----|
| 15 |    |    |    |    |    |    |    |    |    |    |    |    |    |    | 0  |

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| 0 | 0 | 0 | 0 | | | | 0 | 0 | 0 | | | | | | | | | | | | | | | |
| 1 | | | 0 | 0 | 0 | 0 | | | | 0 | 0 | | | | | | | | | | | | | |
| 2 | 40 | 11 | | | | 34 | | | | | | 0 | 0 | | | | | | | | | | | |
| 3 | | | 18 | 37 | 13 | 8 | | | | | | | | 0 | 0 | | | | | | | | | |
| 4 | 35 | | | 28 | | 18 | | | | | | | | | | 0 | 0 | | | | | | | |
| 5 | | 40 | 41 | | | 16 | | | | | | | | | | | | 0 | 0 | | | | | |
| 6 | 39 | | | | 0 | 5 | | | | | | | | | | | | | | 0 | 0 | | | |
| 7 | | | 37 | | 20 | 19 | | | | | | | | | | | | | | | | 0 | 0 | |
| 8 | | 7 | 34 | | | 3 | | | 11 | | 21 | | | | | 34 | | | | | | | | |
| 9 | 36 | | | 0 | 48 | 34 | | 23 | | | | 48 | | | | | | | | | | | | |
| 10 | 33 | | 47 | 21 | 33 | | | | 13 | | | | | | | | 27 | | | | | | | |
| 11 | 43 | 24 | | 16 | | 34 | | | | | | | | 11 | | | | | 1 | | | | | |
| 12 | | | 37 | | | 49 | 19 | | | | | | | | | | 32 | | 17 | | | | | |
| 13 | | 29 | 23 | | 21 | | 16 | | | | | | | 30 | | | | | | | 22 | | | |
| 14 | | 23 | | 26 | 42 | 4 | | 11 | | | | | | | 20 | | | | | | | | | |
| 15 | 0 | | | 7 | | 36 | 22 | | | | | | | | | | 14 | | | | | | 40 | |
| 16 | | 34 | | | 39 | 33 | | | 19 | | | | | 12 | | | | | | 35 | | | | |
| 17 | 20 | 2 | | | 37 | | | | | 13 | | | | | | | | | | | | 12 | | |
| 18 | | | 39 | | 28 | | 45 | | | | | | 17 | | | | | | | 22 | | | | |
| 19 | | 4 | 49 | | | 12 | 8 | 6 | | | | | | | | | 48 | | | | | | | |
| 20 | 13 | 46 | | 31 | | 18 | | | | | | | 0 | | | | | | | | | | 38 | |
| 21 | 4 | 21 | | | 42 | | 1 | | 39 | | | | | 45 | | | | | | | | | | |
| 22 | 48 | | 37 | 23 | | | | | | | | 40 | | | | | | | 26 | | | | | |

FIG.5B

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| 23 | | | 28 | 46 | 7 | | 27 | | | | | | | | 8 | | | | | | | 18 | | |

FIG.5L $$B^T = \begin{bmatrix} P^{a_1} & 0 & \cdots & P^y & \cdots & 0 & 0 \end{bmatrix}$$

$$T = \begin{bmatrix} 1 & 0 & \cdots & 0 & 0 & 0 & 0 \\ P^{a_2} & 1 & 0 & \cdots & 0 & 0 & 0 \\ 0 & P^{a_3} & 1 & \cdots & 0 & 0 & 0 \\ \vdots & \vdots & & & & \vdots & \vdots \\ 0 & 0 & 0 & \cdots & 1 & 0 & 0 \\ 0 & 0 & 0 & \cdots & P^{a_{m-2}} & 1 & 0 \\ 0 & 0 & 0 & \cdots & 0 & P^{a_{m-1}} & 1 \end{bmatrix}$$

$$E = \begin{bmatrix} 0 & 0 & \cdots & 0 & 0 & P^{a_m} \end{bmatrix}$$

$$T^{-1} = \begin{bmatrix} 1 & 0 & 0 & \cdots & 0 & 0 & 0 \\ P^{a_2} & 1 & 0 & \cdots & 0 & 0 & 0 \\ P^{2\sim 3} & P^{a_3} & 1 & \cdots & 0 & 0 & 0 \\ \vdots & \vdots & \vdots & & \vdots & \vdots & \vdots \\ P^{2\sim(m-2)} & P^{3\sim(m-2)} & P^{4\sim(m-2)} & \cdots & 1 & 0 & 0 \\ P^{2\sim(m-1)} & P^{3\sim(m-1)} & P^{4\sim(m-1)} & \cdots & P^{a_{m-2}} & 1 & 0 \\ P^{2\sim m} & P^{3\sim m} & P^{4\sim m} & \cdots & P^{(m-2)(m-1)} & P^{a_{m-1}} & 1 \end{bmatrix}$$

FIG.11

| | INFORMATION PART | | | | | | | | | | PARITY PART | | | | |
|---|---|---|---|---|---|---|---|---|---|---|---|---|---|---|---|
| $P^{a_{11}}$ | $P^{a_{12}}$ | $P^{a_{13}}$ | $P^{a_{14}}$ | ... | $P^{a_{1(n-1)}}$ | $P^{a_{1n}}$ | $P^{a_1}$ | 1 | 0 | 0 | 0 |
| $P^{a_{21}}$ | $P^{a_{22}}$ | $P^{a_{23}}$ | $P^{a_{24}}$ | ... | $P^{a_{2(n-1)}}$ | $P^{a_{2n}}$ | ... | $P^{a_2}$ | 1 | 0 | 0 |
| $P^{a_{31}}$ | $P^{a_{32}}$ | $P^{a_{33}}$ | $P^{a_{34}}$ | ... | $P^{a_{3(n-1)}}$ | $P^{a_{3n}}$ | $P^y$ | 0 | $P^{a_3}$ | 1 | 0 |
| ... | ... | ... | ... | ... | ... | ... | ... | ... | ... | ... | ... |
| $P^{a_{m1}}$ | $P^{a_{m2}}$ | $P^{a_{m3}}$ | $P^{a_{m4}}$ | ... | $P^{a_{m(n-1)}}$ | $P^{a_{mn}}$ | $P^x$ | 0 | 0 | 0 | $P^{a_m}$ |

FIG.12

APPARATUS AND METHOD OF ENCODING/DECODING BLOCK LOW DENSITY PARITY CHECK CODES IN A COMMUNICATION SYSTEM

PRIORITY

This application claims priority under 35 U.S.C. §119(a) to Korean Patent Applications filed in the Korean Intellectual Property Office on Jun. 15, 2006 and assigned Serial No. 2006-54105; and filed in the Korean Intellectual Property Office on Dec. 4, 2006 and assigned Serial No. 2006-121824, the contents of each of which are incorporated herein by reference.

BACKGROUND OF THE INVENTION

1. Field of the Invention

The present invention relates generally to a communication system, and in particular, to an apparatus and method of encoding/decoding block Low Density Parity Check (LDPC) codes.

2. Description of the Related Art

The next generation communication system has evolved into a packet service communication system, which is a system for transmitting burst packet data to a plurality of mobile stations, and is suitable for high-capacity data transmission. In order to increase the data throughput, a Hybrid Automatic Retransmission reQuest (HARQ) scheme and an Adaptive Modulation and Coding (AMC) scheme have been proposed. In order to use the HARQ scheme and the AMC scheme, the next generation communication system has to support a variable code rate.

Generally, block LDPC codes, together with turbo codes, have high performance gain during high-speed data transmission and effectively correct errors caused by noise generated in a transmission channel, contributing to an increase in the reliability of the data transmission.

However, block LDPC codes are disadvantageous because they have a relatively high code rate, and are limited in terms of code rate. Among the currently available block LDPC codes, the major block LDPC codes have a code rate of ½ and only minor block LDPC codes have a code rate of ⅓. The limitation in the code rate exerts a fatal influence on the high-speed, high-capacity data transmission. Although a degree of distribution representing the optimal performance can be calculated using a density evolution scheme in order to implement a relatively low code rate for block LDPC codes, it is difficult to implement a block LDPC code having a degree distribution representing the optimal performance due to various restrictions, such as a cycle structure in a factor graph and hardware implementation. In view of the code rate limitations for block LDPC codes, it is necessary to support a variable code rate, from low code rate to high low code rate, in order to transmit/receive signals.

SUMMARY OF THE INVENTION

An aspect of the present invention is to substantially solve at least the above problems and/or disadvantages and to provide at least the advantages below. Accordingly, one aspect of the present invention is to provide an apparatus and method of encoding/decoding block Low Density Parity Check (LDPC) codes in a communication system.

According to another aspect of the present invention, there is provided a signal transmission/reception apparatus and method of generating a parity check matrix of a block LDPC code in a communication system.

BRIEF DESCRIPTION OF THE DRAWINGS

The above and other objects, features and advantages of the present invention will become more apparent from the following detailed description when taken in conjunction with the accompanying drawings in which:

FIG. 1 is a diagram illustrating a parity check matrix of a block LDPC code according to the present invention;

FIGS. 3A-3L are diagrams illustrating matrixes corresponding to partial blocks of a child parity check matrix illustrated in FIG. 2;

FIGS. 5A-5L are diagrams illustrating matrixes corresponding to partial blocks of a child parity check matrix illustrated in FIG. 4;

FIG. 11 is a diagram illustrating is a diagram of a transpose matrix of the partial matrix B illustrated in FIG. 1, the partial matrix E illustrated in FIG. 1, the partial matrix T illustrated in FIG. 1 and an inverse matrix of the partial matrix T illustrated in FIG. 1;

FIG. 12 is a diagram illustrating a parity check matrix having a form similar to the form of the full lower triangular matrix.

DETAILED DESCRIPTION OF THE PREFERRED EMBODIMENTS

Figure 2:
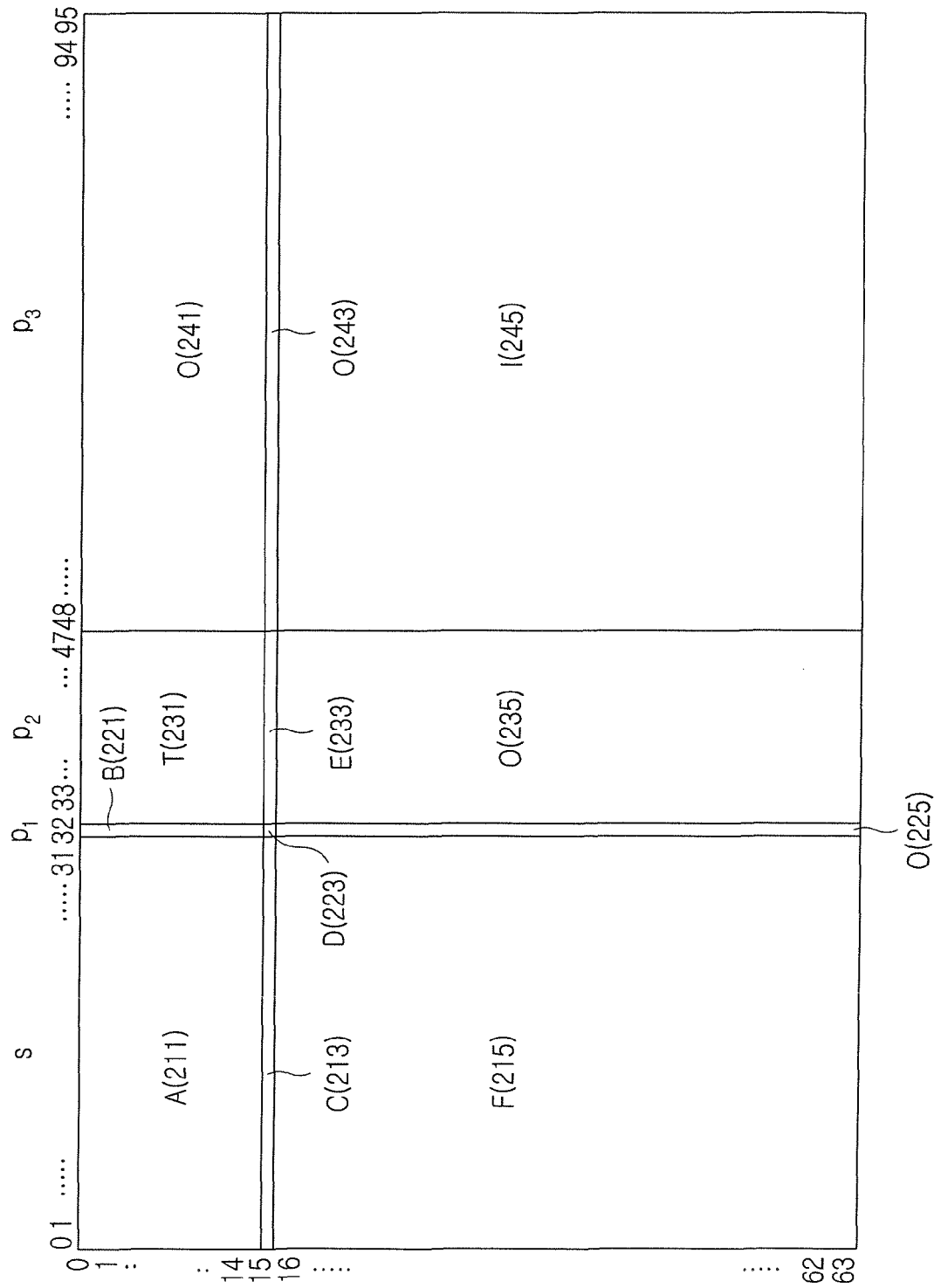
FIG. 2 is a diagram illustrating a child parity check matrix according to the present invention when a code rate of a parent codeword vector is ⅔, and a code rate of a child codeword vector is ⅓.

Preferred embodiments of the present invention will now be described in detail with reference to the annexed drawings. In the following description, a detailed description of known functions and configurations incorporated herein has been omitted for the sake of clarity and conciseness.

The present invention discloses an apparatus and method of transmitting/receiving signals supporting a variable code rate in a communication system using a block Low Density Parity Check (LDPC) code. That is, the present invention provides an apparatus and method of transmitting/receiving signals using a parent parity check matrix supporting various code rates in a communication system using an LDPC code, with minimized encoding complexity.

In the next generation communication system, in order to increase the data throughput, a HARQ scheme and an Adaptive Modulation and Coding (AMC) scheme have been proposed. In order to use the HARQ scheme and the AMC scheme, the next generation communication system has to support a variable code rate.

Further, the next generation communication systems are considering a block Low Density Parity Check (LDPC) code. Generally, there is a limitation in a code rate of a block LDPC code. So, the present invention provides an apparatus and method of transmitting/receiving a signal supporting a plurality of code rates in a communication system using a block LDPC code.

FIG. 1 is a diagram illustrating a parity check matrix of a block LDPC code according to the present invention.

In FIG. 1, the parity check matrix includes a parent parity check matrix and a child parity check matrix. The parent parity check matrix is used to generate a parent codeword vector, and the child parity check matrix is used to generate a child codeword vector. Herein, a code rate of the parent parity check matrix is greater than a code rate of the child parity check matrix. The parent parity check matrix includes an information part 's', a first parity part '$p_1$', and a second parity part '$p_2$'. The child parity check matrix includes the information part s, the first parity part $p_1$, the second parity part '$p_2$' and a third parity part '$p_3$'.

The information part s represents a part of the parity check matrix, mapped to an information vector when a codeword vector is generated by encoding the information vector. The first parity part $p_1$ represents a part of the parity check matrix, mapped to a first parity vector, the second parity part $p_2$ represents a part of the parity check matrix, mapped to a second parity vector, and the third parity part $p_3$ represents a part of the parity check matrix, mapped to a third parity vector. The information vector includes at least one information bit, and each of the first parity vector, the second parity vector and the third parity vector includes at least one parity bit.

A parity check matrix of the block LDPC code includes a plurality of blocks, and a permutation matrix or a zero matrix is mapped to each of the blocks. The permutation matrix and the zero matrix have an $N_s \times N_s$ size. Each of $N_s$ columns constituting the permutation matrix has a weight of 1 and each of $N_s$ rows constituting the permutation matrix also has a weight of 1. Herein, it is assumed that the parity check matrix includes a plurality of partial blocks in order to facilitate a method of designing a parity check matrix of the block LDPC code and a method of encoding the block LDPC code. The partial block includes at least one block.

First, the parent parity check matrix will be described below.

The parent parity check matrix includes six partial blocks A 111, C 113, B 121, D 123, T 131 and E 133. The partial block A 111 and the partial block C 113 correspond to the information part s. A matrix mapped the partial block A 111 is a partial matrix A, and a matrix mapped the partial block C 113 is a partial matrix C. The partial blocks B 121 and D 123 correspond to the first parity part $p_1$. A matrix mapped the partial block B 121 is a partial matrix B, and a matrix mapped the partial block D 123 is a partial matrix D. The partial block T 131 and the partial block E 133 correspond to the second parity part $p_2$. A matrix mapped the partial block T 131 is a partial matrix T, and a matrix mapped the partial block E 133 is a partial matrix E.

Second, the child parity check matrix will be described below.

The child parity check matrix includes twelve partial blocks A 111, C 113, B 121, D 123, T 131, E 133, F 115, O 125, 0 135, 0 141, 0 143, I 145. The partial block A 111, the partial block C 113 and the partial block F 115 correspond to the information part s. A matrix mapped the partial block F 115 is a partial matrix F. The partial blocks B 121, D 123 and O 125 correspond to the first parity part $p_1$. A matrix mapped the partial block O 125 is a partial matrix 0. Herein, all elements of the partial matrix 0 are 0. The partial block T 131, the partial block E 133 and the partial block 0 135 correspond to the second parity part $p_2$. A matrix mapped the partial block O 135 is a partial matrix 0. The partial block 0 141, the partial block 0 143 and the partial block I 145 correspond to the third parity part $p_3$. A matrix mapped the partial block T 0 141 is partial matrix 0, a matrix mapped the partial block 0 143 is partial matrix 0 and a matrix mapped the partial block I 145 is a partial matrix I. Herein, the partial matrix I is an identity matrix.

In FIG. 1, a partial matrix 0 is arranged in each of the partial blocks 0 125, 0 135, 0 141, 0 143 for the convenience of explanation. The partial blocks 0 125, 0 135, 0 141, 0 143 illustrated in FIG. 1 may also correspond to another type of matrix, i.e., non-partial matrix 0.

As described above, a child block LDPC codeword includes the parent block LDPC codeword and a single parity check code when a child parity check matrix having a code rate less than a code rate of a parent parity check matrix is generated.

Accordingly, the size of a child parity block LDPC codeword check matrix, namely the size of a child parity check matrix, is determined corresponding to its code rate; a partial block I 145 is added to be diagonal to a partial block E 133 of a parent parity check matrix in a block unit corresponding to the determined size; and the other parts, namely a partial block F 115, a partial block 0 125, a partial block 0 135, a partial block 0 141 and a partial block 0 143, are added.

The parity check matrix generation operation using the parent parity check matrix and the child parity check matrix was described by way of example. However, the parity check matrix can be generated using a first parity check matrix with a first code rate and a second parity check matrix with a second code rate in manner as described above.

As described above, the child parity check matrix includes all blocks included in the parent parity check matrix and additional blocks. A structure of the child parity check matrix has an extended structure of the parent parity check matrix. So, a parent codeword vector can be generated using the parent parity check matrix, and a child codeword vector can be generated using the child parity check matrix. Herein, a code rate of the child codeword vector is less than a code rate of the parent codeword vector.

On the contrary, it may occur that a child codeword vector having a code rate greater than the code rate of the parent codeword vector may be generated. In this case, the child codeword vector having the code rate greater than the code rate of the parent codeword vector is generated by puncturing at least one parity bit among a parity vector included in the parent codeword vector. That is, a puncturing scheme is used for using a code having a code rate R2 using a code having a code rate R1. In the present invention, a codeword having a code rate greater than the code rate of the child codeword vector can be generated by puncturing a third parity vector generated using a child parity check matrix.

Otherwise, in the process of decoding a codeword of a block LDPC code generated using the puncturing scheme, the original parity check matrix is used by regarding the punctured parity bits as erased bits. That is, if a Log-Likelihood Ratio (LLR) value input from a channel over which the punctured parity bits are transmitted is always regarded as '0', the original parity check matrix can be used as it is, during decoding. Therefore, a punctured codeword node transmit only '0' in a decoding process when codeword bits corresponding to column with degree 1, of a parity check matrix. So, output signal from a check node connected to the punctured codeword is always '0', it is possible to delete rows connected to the punctured codeword.

When punching the newly added codeword bits in order to generate codeword vector having lower code rate, identical effect to when performing encoding/decoding by using parent parity check matrix is obtained. That is, when generating a LDPC code having high code rate by using the child parity check matrix, the encoding/decoding can be performed by using a parent parity check matrix excepting the additionally generated part from a child parity check matrix, and when generating a LDPC code having low code rate, the whole child parity check matrix can be used. Although, as an example, it describes one case of increasing code rate by puncturing parity bits, increasing code rate by puncturing information bits is also possible.

In conclusion, a parent codeword vector, a child codeword vector having code rate less than code rate of the parent codeword vector, and a child codeword vector having code rate greater than code rate of the parent codeword vector can be generated by only using the child parity check matrix.

As described above, because each of the partial blocks includes at least one block, the child parity check matrix includes a plurality of blocks.

A child parity check matrix, according to the present invention when a code rate of a parent codeword vector is ⅔, and a code rate of a child codeword vector is ⅓, will be described below with reference to FIG. 2 and FIGS. 3A-3L.

FIG. 2 is a diagram illustrating a child parity check matrix according to the present invention when a code rate of a parent codeword vector is ⅔, and a code rate of a child codeword vector is ⅓.

In FIG. 2, since the code rate of the parent codeword vector is ⅔, the parent parity check matrix of the code rate ⅔ includes an information part s including 32 block columns and 16 block rows, a first parity part $p_1$ including 1 block column and 16 block rows, and a second parity part $p_2$ including 15 block columns and 16 block rows. That is, the information part s includes a partial matrix A 211 and a partial matrix C 213, the first parity part $p_1$ includes a partial matrix B 221 and a partial matrix D 223, and the second parity part $p_2$ includes a partial matrix T 231 and a partial matrix E 233.

Since the code rate of the child codeword vector is ⅓, the child parity check matrix of the code rate ⅓ includes an information part s including 32 block columns and 64 block rows, a first parity part $p_1$ including 1 block column and 64 block rows, a second parity part $p_2$ including 15 block columns and 64 block rows, and a third parity part $p_3$ including 48 block columns and 64 block rows. That is, the information part s includes the partial matrix A 211, the partial matrix C 213, and a partial matrix F 215, the first parity part $p_1$ includes the partial matrix B 221, the partial matrix D 223, and a partial matrix 0 225, and the second parity part $p_2$ includes the partial matrix T 231, the partial matrix E 233, and a partial matrix 0 235, and the third parity part $p_3$ includes a partial matrix 0 241, partial matrix 0 243, and a partial matrix I 245.

The partial matrixes A 211, C 213, F 215, B 221, D 223, 0 225, T 231, E 233, 0 235, 0 241, 0 243, I 245 will be described below with reference to FIGS. 3A-3L.

FIGS. 3A-3L are diagrams illustrating matrixes corresponding to partial blocks of a child parity check matrix illustrated in FIG. 2.

In FIGS. 3A-3L, a number illustrated in each of blocks represents exponent of each of permutation matrixes arranged in each of the blocks. Herein, it is assumed that the permutation matrix is expressed as $P^a$. If a=0, $P^0$ is an identity matrix. As increase of value of a, the permutation matrix is generated by cyclic-shifting a location of a value of 1 of each of rows on the identity matrix in a right direction. If there is no number illustrated in each of the blocks, a 0 matrix is arranged in each of the blocks.

In FIG. 3A, the partial matrix A 211 includes 32 block columns and 15 block rows. As illustrated in FIG. 3A, one of a permutation matrix and a 0 matrix is arranged in each of blocks of the partial matrix A 211.

In FIG. 3B, the partial matrix C 213 includes 32 block columns and 1 block row. As illustrated in FIG. 3B, one of a permutation matrix and a 0 matrix is arranged in each of blocks of the partial matrix C 213.

Figure 3C:
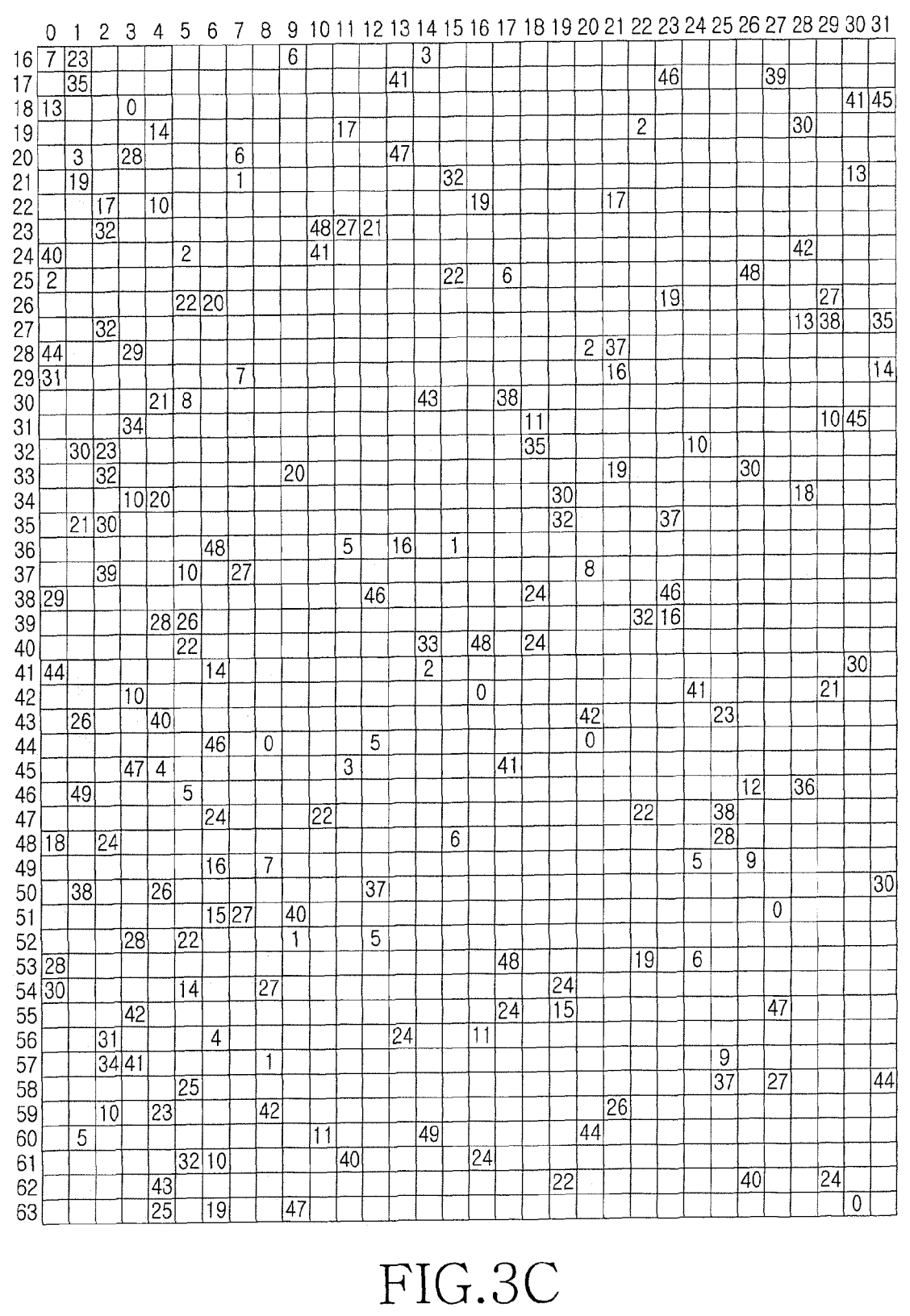

In FIG. 3C, the partial matrix F 215 includes 32 block columns and 48 block rows. As illustrated in FIG. 3C, one of a permutation matrix and a 0 matrix is arranged in each of blocks of the partial matrix F 215.

Figures 3D, 3E, 3F:
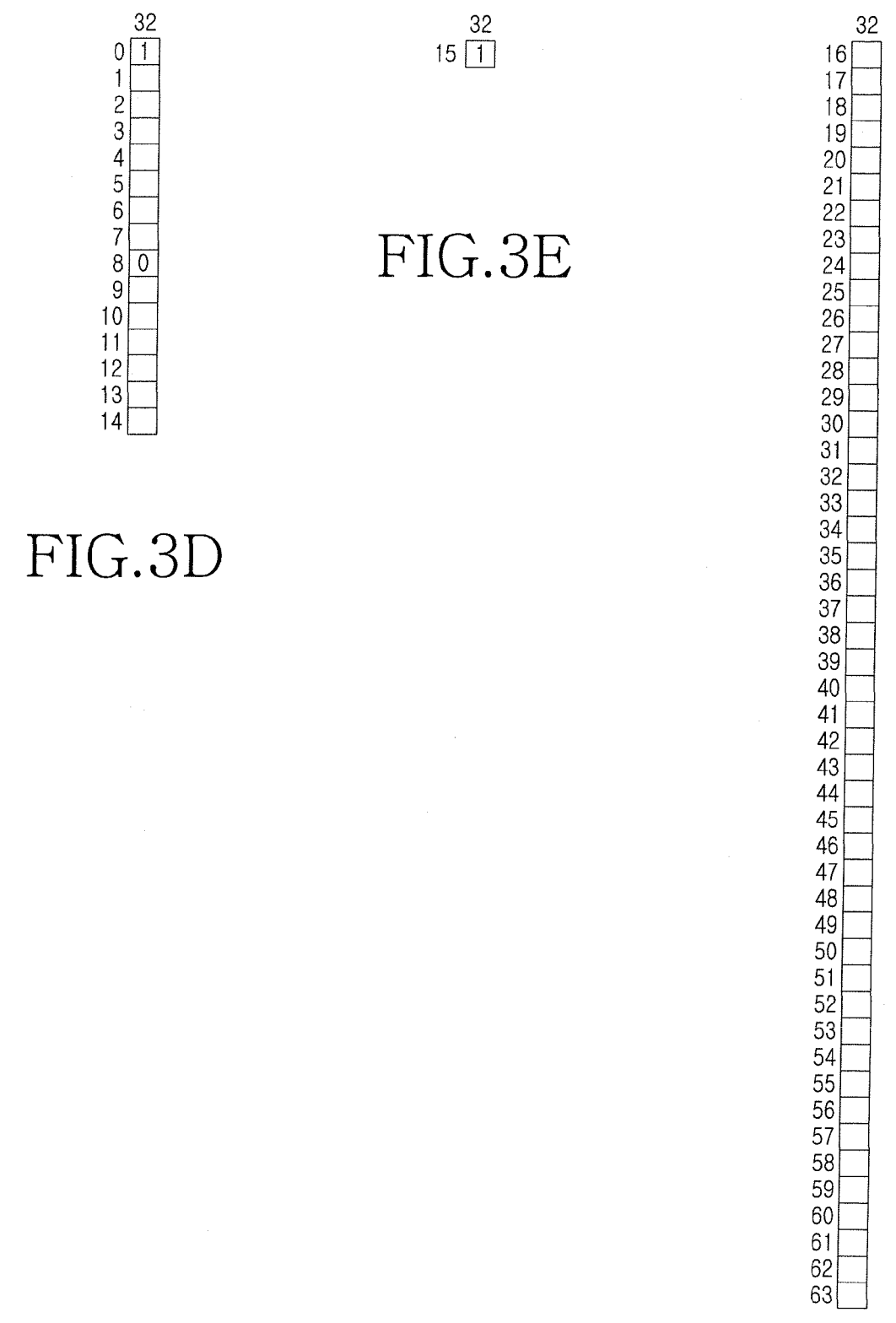

In FIG. 3D, the partial matrix B 221 includes 1 block column and 16 block rows. As illustrated in FIG. 3D, one of a permutation matrix and a 0 matrix is arranged in each of blocks of the partial matrix B 221.

In FIG. 3E, the partial matrix D 223 includes 1 block column and 1 block row. As illustrated in FIG. 3E, a permutation matrix is arranged in the partial matrix D 223.

In FIG. 3F, the partial matrix 0 225 includes 1 block column and 48 block rows. As illustrated in FIG. 3F, a 0 matrix is arranged in each of blocks of the partial matrix 0 225.

In FIG. 3G, the partial matrix T 231 includes 15 block columns and 15 block rows. As illustrated in FIG. 3G, one of a permutation matrix and a 0 matrix is arranged in each of blocks of the partial matrix T 231.

In FIG. 3H, the partial matrix E 233 includes 15 block columns and 1 block row. As illustrated in FIG. 3H, one of a permutation matrix and a 0 matrix is arranged in each of blocks of the partial matrix E 233.

Figure 3I:
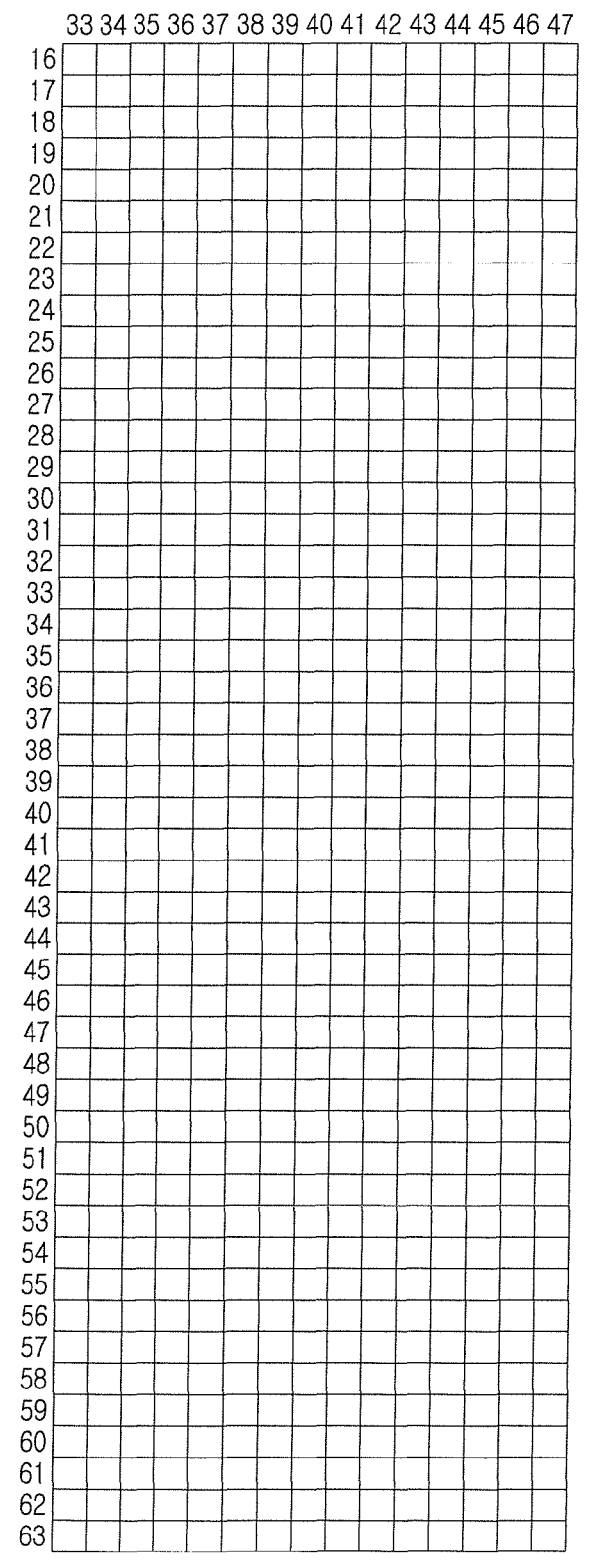

In FIG. 3I, the partial matrix 0 235 includes 15 blocks column and 48 block rows. As illustrated in FIG. 3I, a 0 matrix is arranged in each of blocks of the partial matrix 0 235.

Figure 3J:
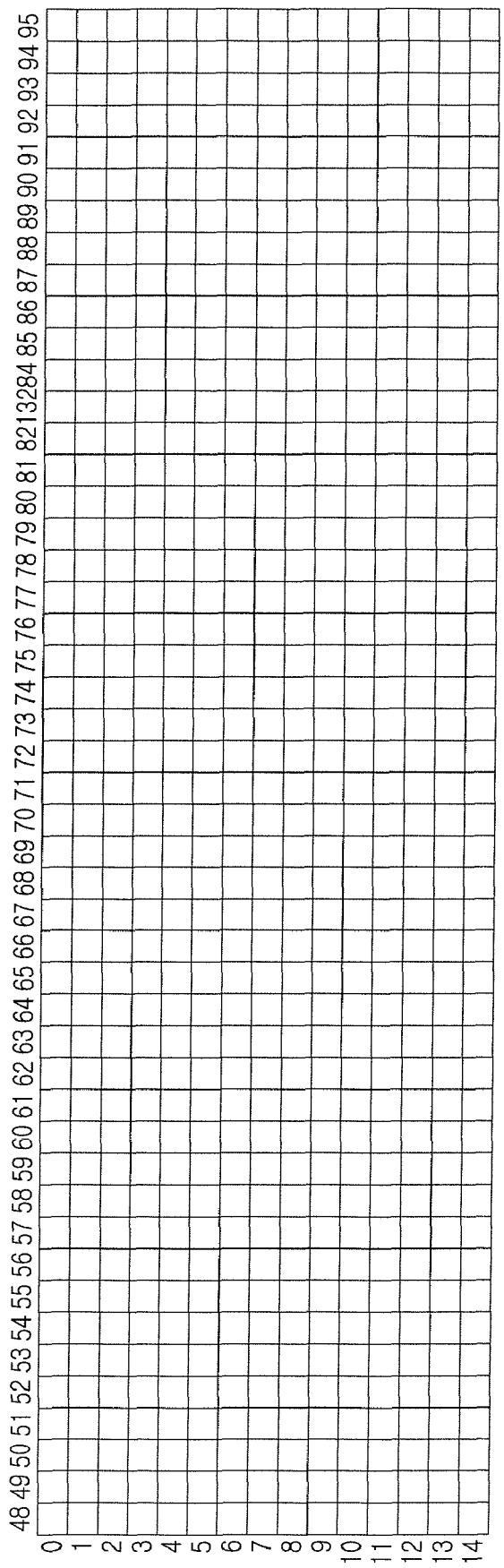

In FIG. 3J, the partial matrix 0 241 includes 48 blocks column and 15 block rows. As illustrated in FIG. 3J, a 0 matrix is arranged in each of blocks of the partial matrix 0 241.

Figure 3K:
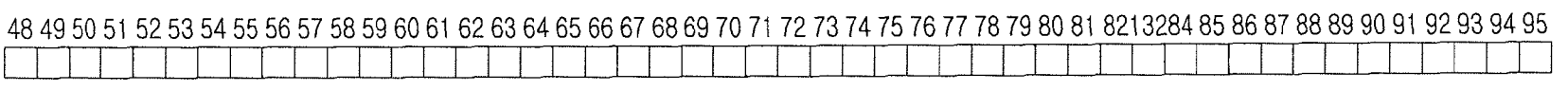

In FIG. 3K, the partial matrix 0 243 includes 48 blocks column and 1 block row. As illustrated in FIG. 3K, a 0 matrix is arranged in each of blocks of the partial matrix 0 243.

Figure 3L:
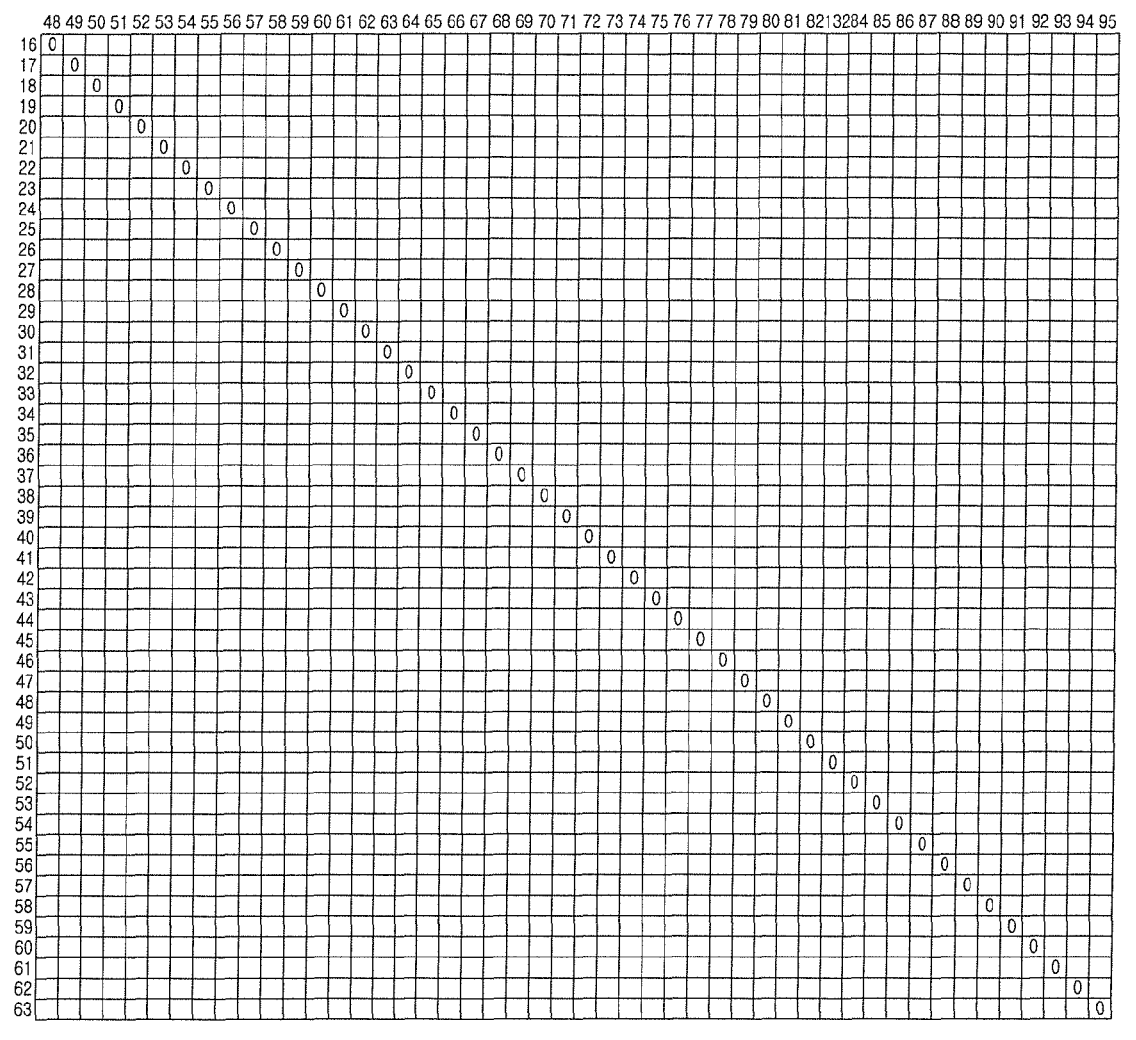

In FIG. 3L, the partial matrix I 245 includes 48 block columns and 48 block rows. As illustrated in FIG. 3L, one of a permutation matrix and a 0 matrix is arranged in each of blocks of the partial matrix I 245.

A child parity check matrix, according to the present invention when a code rate of a parent codeword vector is ½, and a code rate of a child codeword vector is ¼, will be described below with reference to FIG. 4 and FIGS. 5A-5L.

Figure 4:
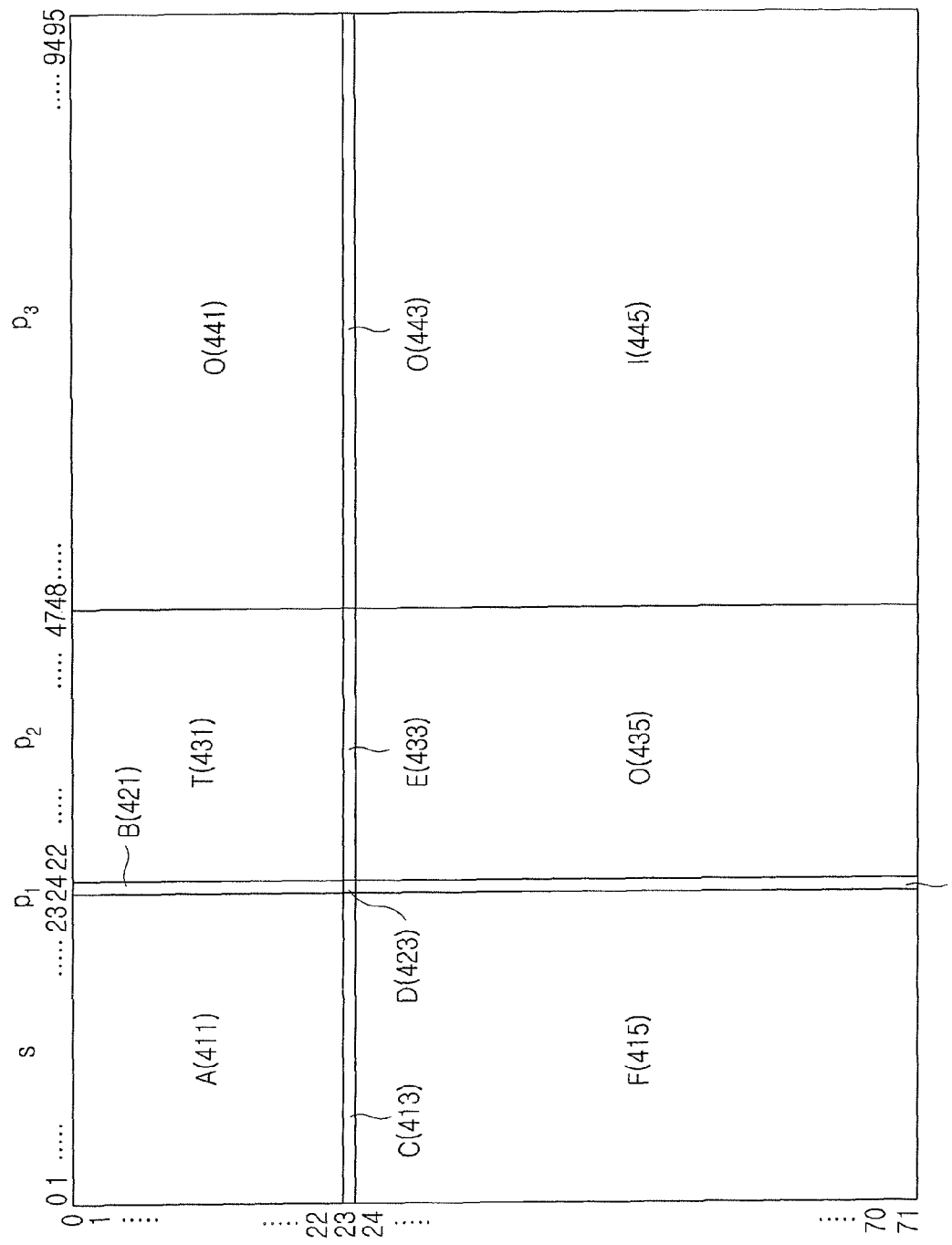
FIG. 4 is a diagram illustrating a child parity check matrix according to the present invention when a code rate of a parent codeword vector is ½, and a code rate of a child codeword vector is ¼.

FIG. 4 is a diagram illustrating a child parity check matrix according to the present invention when a code rate of a parent codeword vector is ½, and a code rate of a child codeword vector is ¼.

In FIG. 4, since the code rate of the parent codeword vector is ½, the parent parity check matrix of the code rate ½ includes an information part s including 24 block columns and 24 block rows, a first parity part $p_1$ including 1 block column and 24 block rows, and a second parity part $p_2$ including 23 block columns and 24 block rows. That is, the information part s includes a partial matrix A 411 and a partial matrix C 413, the first parity part $p_1$ includes a partial matrix B 421 and a partial matrix D 423, and the second parity part $p_2$ includes a partial matrix T 431 and a partial matrix E 433.

In this case, since the code rate of the child codeword vector is ¼, the child parity check matrix of the code rate ¼ includes an information part s including 24 block columns and 72 block rows, a first parity part $p_1$ including 1 block column and 72 block rows, a second parity part $p_2$ including 23 block columns and 72 block rows, and a third parity part $p_3$ including 48 block columns and 72 block rows. That is, the information part s includes the partial matrix A 411, the partial matrix C 413, and a partial matrix F 415, the first parity part $p_1$ includes the partial matrix B 421, the partial matrix D 423, and a partial matrix 0 425, and the second parity part $p_2$ includes the partial matrix T 431, the partial matrix E 433, and a partial matrix 0 435, and the third parity part $p_3$ includes a partial matrix 0 441, partial matrix 0 443, and a partial matrix I 445.

The partial matrixes A 411, C 413, F 415, B 421, D 423, 0 425, T 431, E 433, 0 435, 0 441, 0 443, I 445 will be described below with reference to FIGS. 5A-5L.

FIGS. 5A-5L are diagrams illustrating matrixes corresponding to partial blocks of a child parity check matrix illustrated in FIG. 4.

In FIGS. 5A-5L, a number illustrated in each of blocks represents exponent of each of permutation matrixes arranged in each of the blocks. If there is no number illustrated in each of the blocks, a 0 matrix is arranged in each of the blocks.

In FIG. 5A, the partial matrix A 411 includes 24 block columns and 23 block rows. As illustrated in FIG. 5A, one of a permutation matrix and a 0 matrix is arranged in each of blocks of the partial matrix A 411.

In FIG. 5B, the partial matrix C 413 includes 24 block columns and 1 block row. As illustrated in FIG. 5B, one of a permutation matrix and a 0 matrix is arranged in each of blocks of the partial matrix C 413.

Figure 5C:
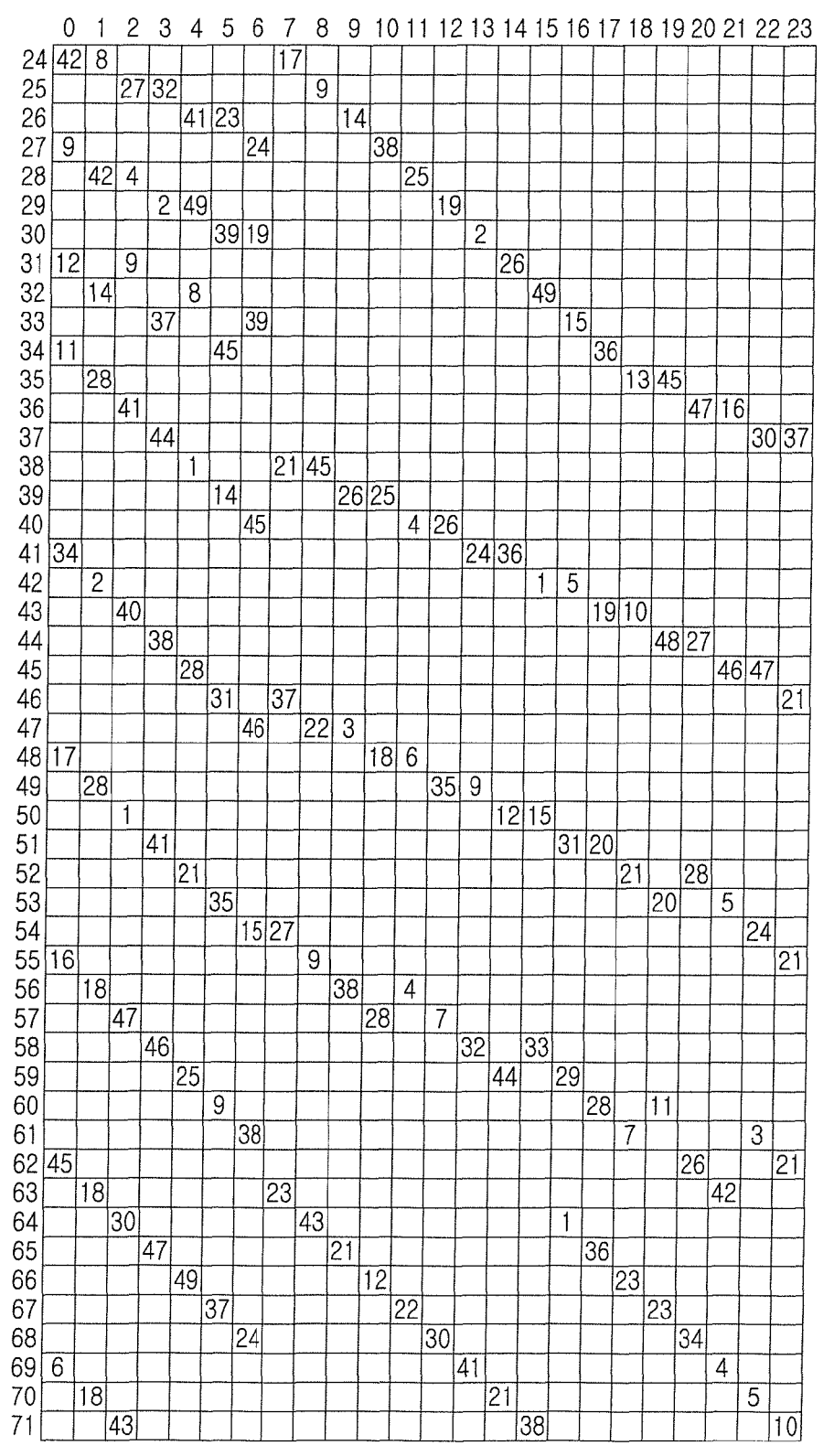

In FIG. 5C, the partial matrix F 415 includes 24 block columns and 48 block rows. As illustrated in FIG. 5C, one of a permutation matrix and a 0 matrix is arranged in each of blocks of the partial matrix F 415.

Figures 5D, 5E, 5F:
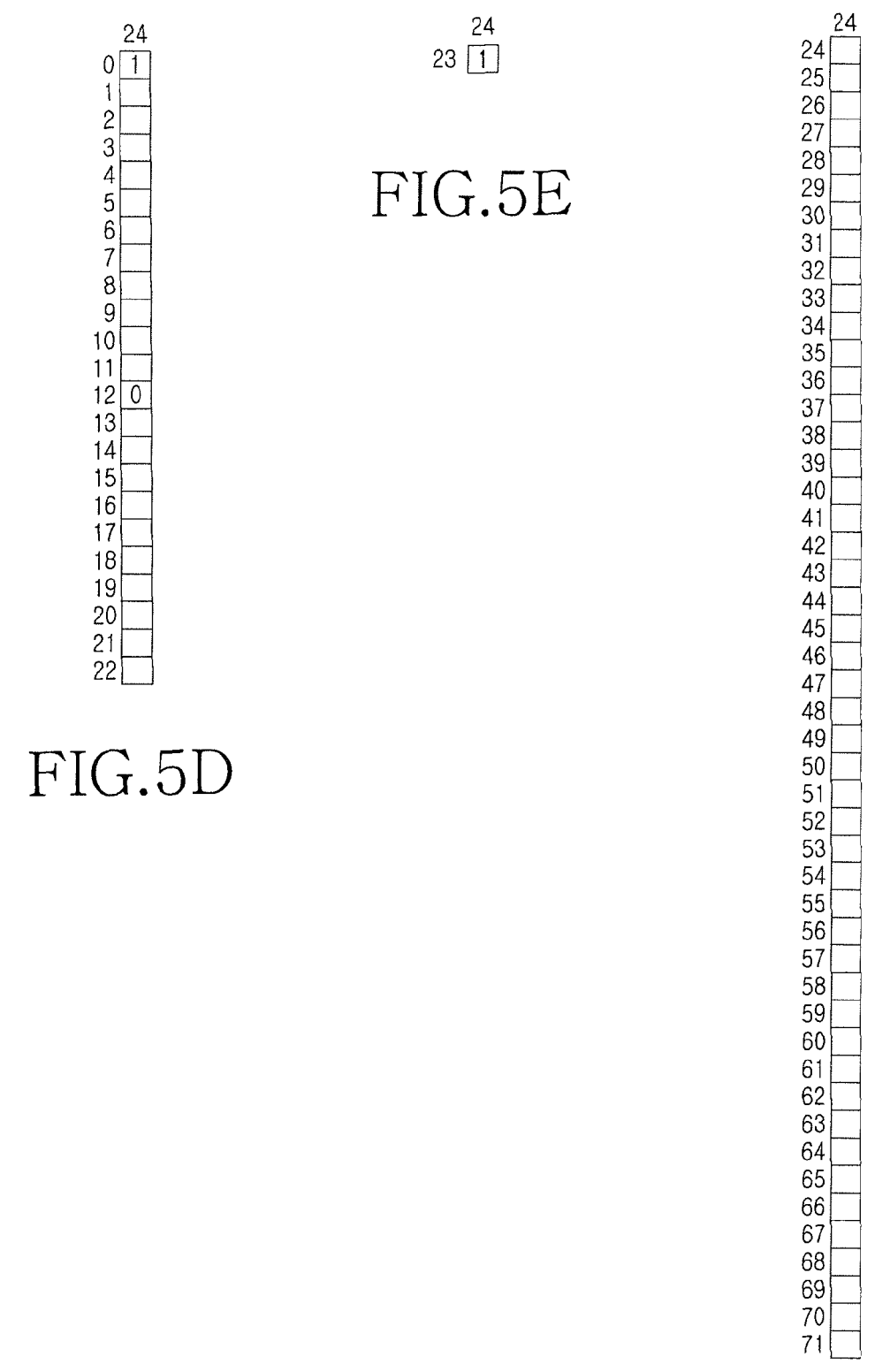

In FIG. 5D, the partial matrix B 421 includes 1 block column and 23 block rows. As illustrated in FIG. 5D, one of a permutation matrix and a 0 matrix is arranged in each of blocks of the partial matrix B 421.

In FIG. 5E, the partial matrix D 423 includes 1 block column and 1 block row. As illustrated in FIG. 5E, a permutation matrix is arranged in the partial matrix D 423.

In FIG. 5F, the partial matrix 0 425 includes 1 block column and 48 block rows. As illustrated in FIG. 5F, a 0 matrix is arranged in each of blocks of the partial matrix 0 425.

Figures 5G, 5H:
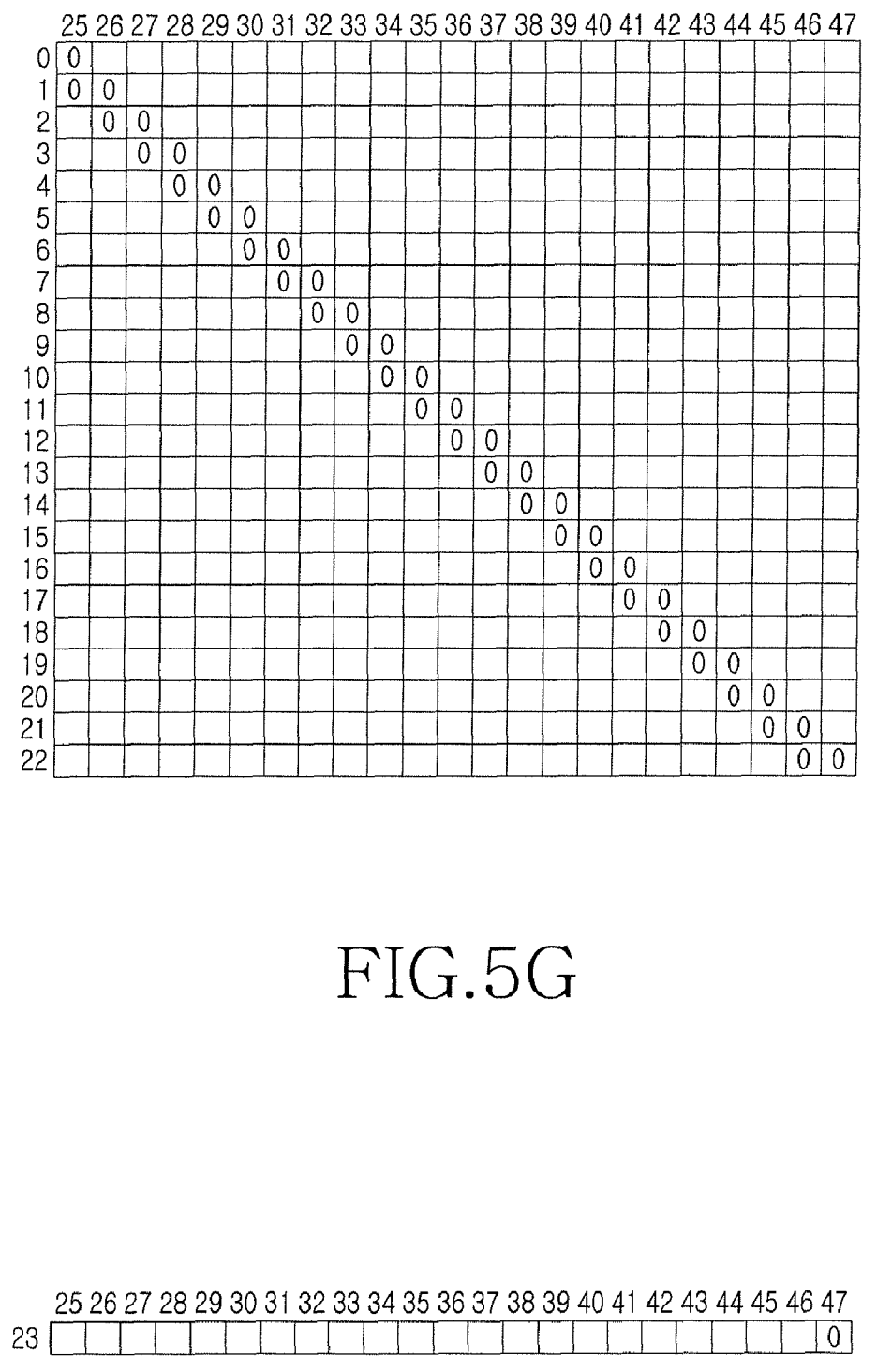

In FIG. 5G, the partial matrix T 431 includes 23 block columns and 23 block rows. As illustrated in FIG. 5G, one of a permutation matrix and a 0 matrix is arranged in each of blocks of the partial matrix T 431.

In FIG. 5H, the partial matrix E 433 includes 23 block columns and 1 block row. As illustrated in FIG. 5H, one of a permutation matrix and a 0 matrix is arranged in each of blocks of the partial matrix E 433.

Figure 5I:
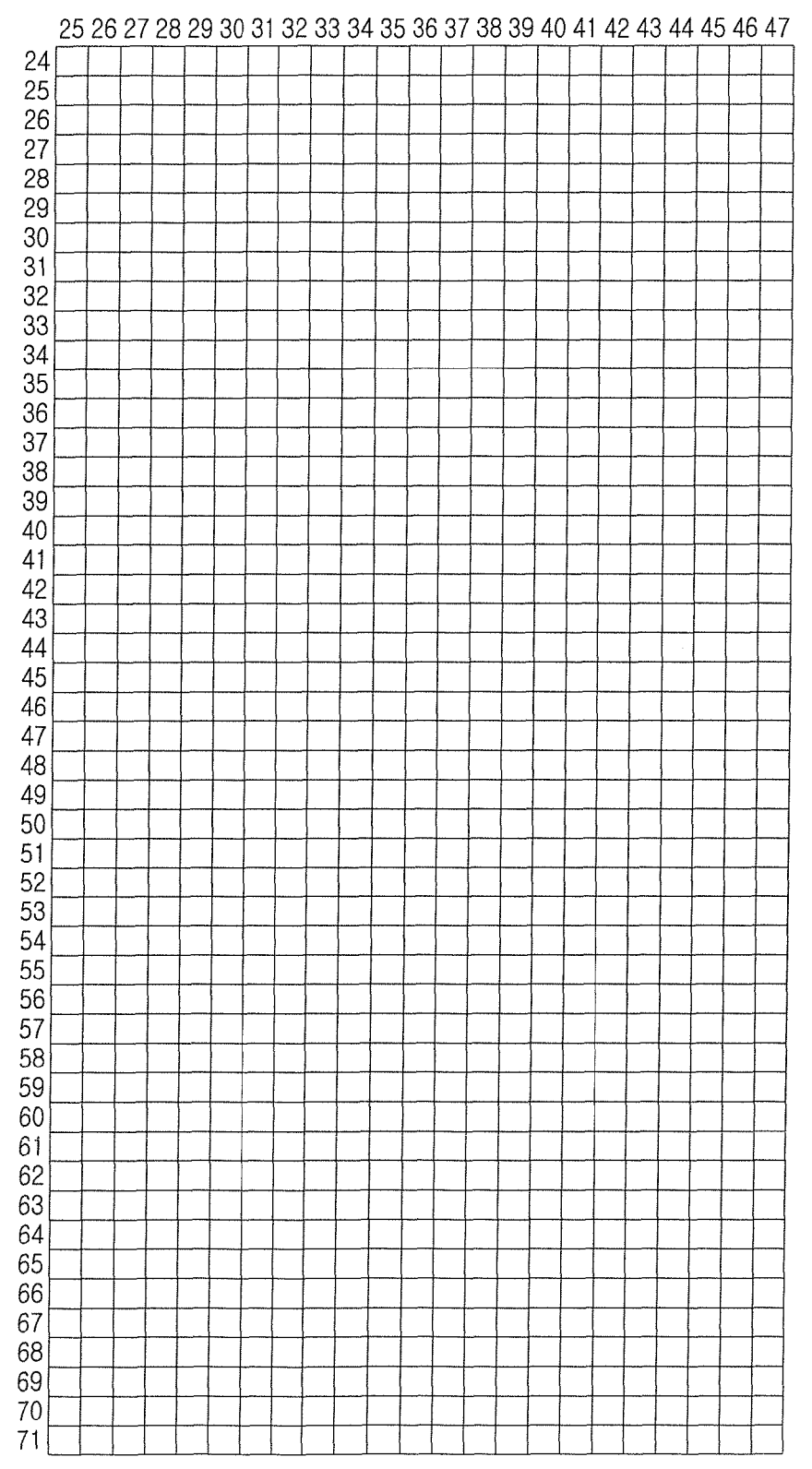

In FIG. 5I, the partial matrix 0 435 includes 23 blocks column and 48 block rows. As illustrated in FIG. 5I, a 0 matrix is arranged in each of blocks of the partial matrix 0 435.

Figure 5J:
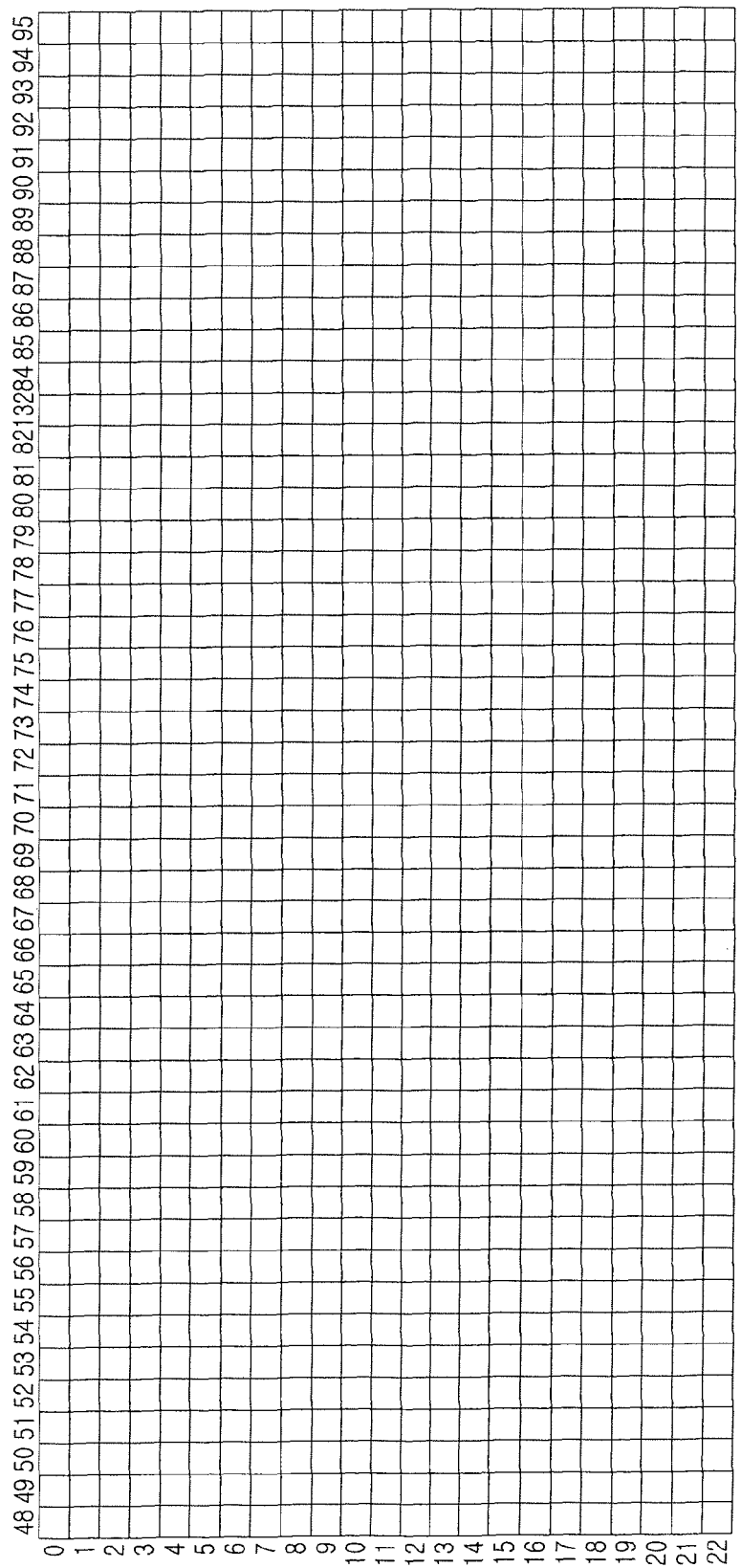

In FIG. 5J, the partial matrix 0 441 includes 48 blocks column and 23 block rows. As illustrated in FIG. 5J, a 0 matrix is arranged in each of blocks of the partial matrix 0 441.

Figure 5K:
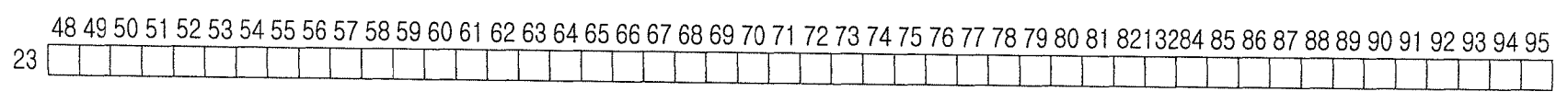

In FIG. 5K, the partial matrix 0 443 includes 48 blocks column and 1 block row. As illustrated in FIG. 5K, a 0 matrix is arranged in each of blocks of the partial matrix 0 443.

Figure 5L:
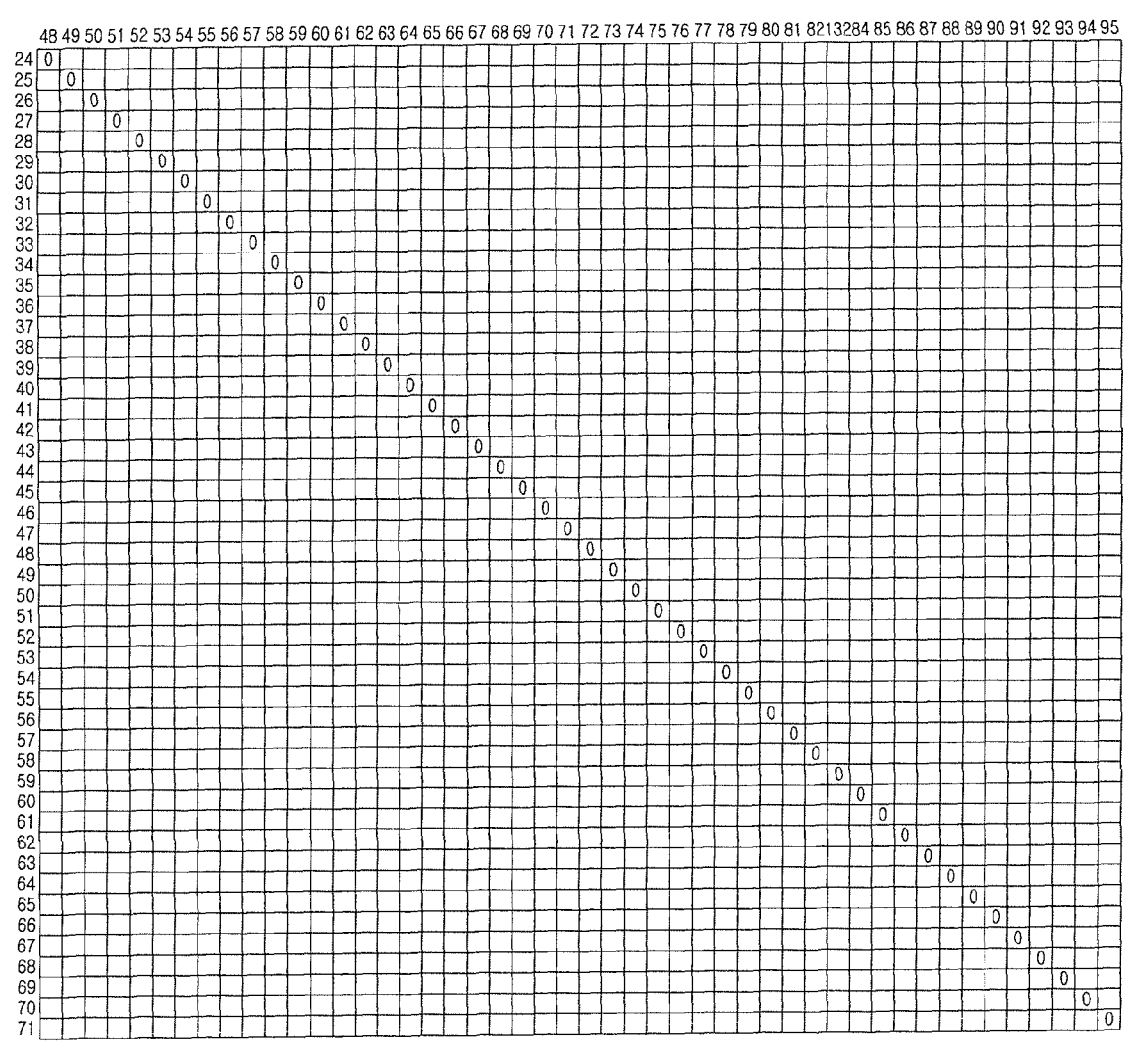

In FIG. 5L, the partial matrix I 445 includes 48 block columns and 48 block rows. As illustrated in FIG. 5L, one of a permutation matrix and a 0 matrix is arranged in each of blocks of the partial matrix I 445.

A signal transmission apparatus according to the present invention will be described below with reference to FIG. 6.

Figure 6:
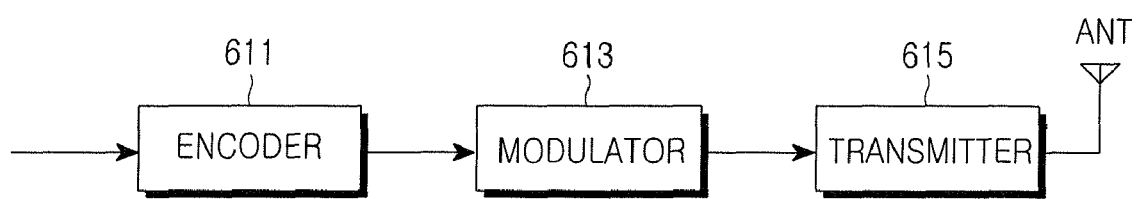
FIG. 6 is a diagram illustrating the structure of a signal transmission apparatus according to the present invention.

FIG. 6 is a block diagram illustrating the structure of a signal transmission apparatus according to the present invention.

In FIG. 6, the signal transmission apparatus according to the present invention includes an encoder 611, a modulator 613 and a transmitter 615. If an information vector to be transmitted occurs in the signal transmission apparatus, the information vector is delivered to the encoder 611. The encoder 611 generates a codeword vector, that is, a block LDPC codeword by encoding the information vector in an encoding scheme, and then outputs the generated codeword vector to the modulator 613. The encoding scheme corresponds to a LDPC encoding scheme, according to the present invention, supporting a plurality of code rates. An internal structure of the encoder 611 is described below with reference to FIG. 8 and FIG. 13.

The modulator 613 generates a modulation vector by modulating the codeword vector in a modulation scheme, and then outputs the generated modulation vector to the transmitter 615. The transmitter 615 inputs therein the modulation vector output from the modulator 613, executes transmission signal processing for the input modulation vector, and then transmits the processed modulation vector to a signal reception apparatus through an antenna.

A signal reception apparatus according to the present invention will be described in detail below with reference to FIG. 7.

Figure 7:
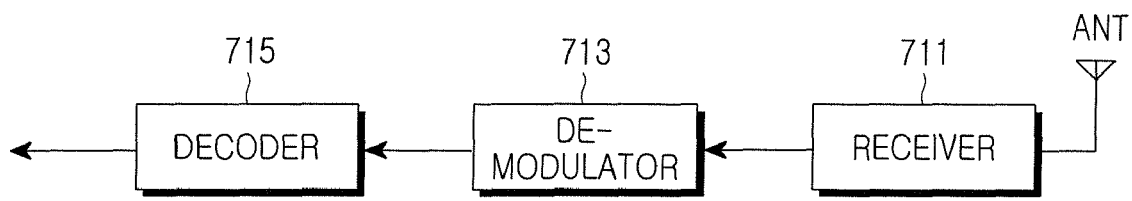
FIG. 7 is a diagram illustrating the structure of a signal reception apparatus according to the present invention.

FIG. 7 is a block diagram illustrating the structure of a signal reception apparatus according to the present invention.

In FIG. 7, the signal reception apparatus according to the present invention includes a receiver 711, a demodulator 713 and a decoder 715. A signal transmitted by a signal transmission apparatus is received through an antenna of the signal reception apparatus, and the received signal is delivered to the receiver 711. The receiver 711 executes reception signal processing for the received signal to thereby generate a reception vector, and then outputs the processed and generated reception vector to the demodulator 713. The demodulator 713 inputs therein the reception vector output from the receiver 711, generates a demodulation vector by demodulating the input reception vector in a demodulation scheme corresponding to a modulation scheme applied to a modulator of the signal transmission apparatus, that is, the modulator 613, and then outputs the generated demodulation vector to the decoder 715. The decoder 715 inputs therein the demodulation vector output from the demodulator 713, decodes the input demodulation vector in a decoding scheme corresponding to an encoding scheme applied to an encoder of the signal transmission apparatus, that is, the encoder 611, and then outputs the decoded demodulation vector into a finally restored information vector. An internal structure of the decoder 715 is described below with reference to FIG. 9.

Figure 8:
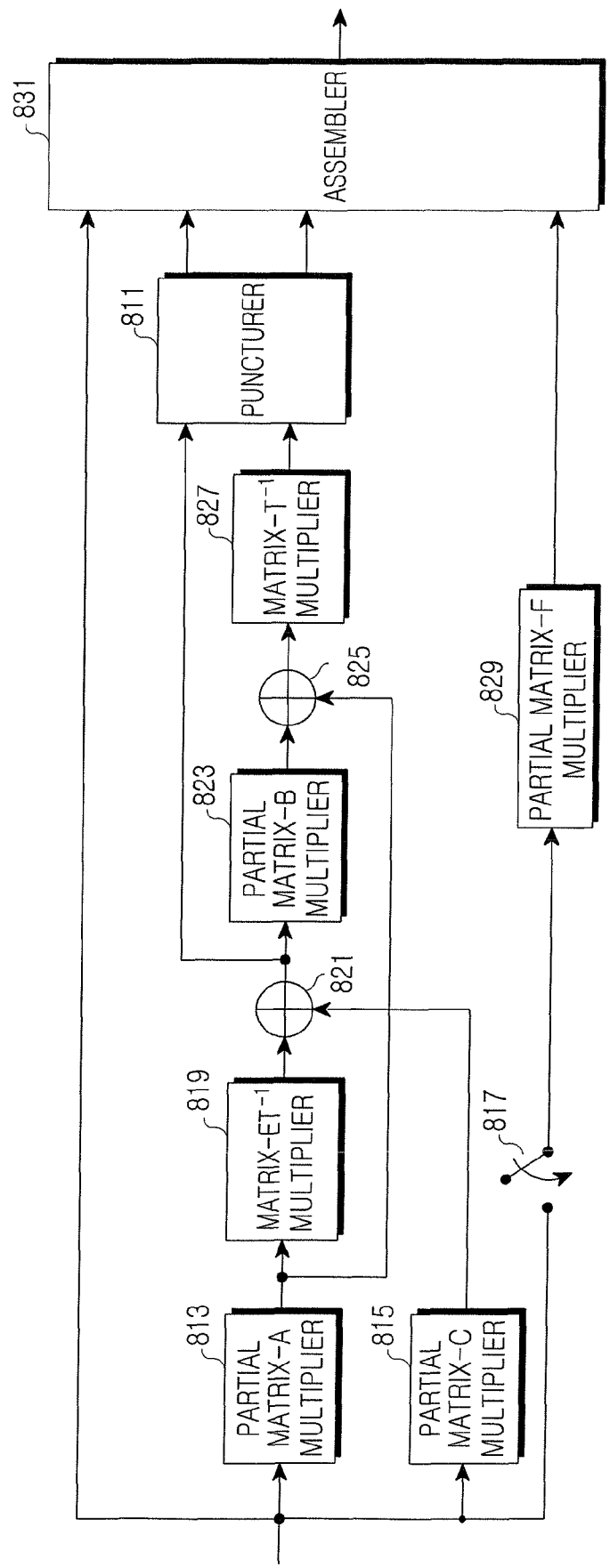
FIG. 8 is a diagram illustrating one internal structure of an encoder as illustrated in FIG. 6.

FIG. 8 is a diagram illustrating one internal structure of an encoder 611 as illustrated in FIG. 6.

In FIG. 8, the encoder 611 includes a puncturer 811, a partial matrix-A multiplier 813, a partial matrix-C multiplier 815, a switch 817, a partial matrix-$ET^{-1}$ multiplier 819, an XOR operator 821, a partial matrix-B multiplier 823, an XOR operator 825, a partial matrix-$T^{-1}$ multiplier 827, a partial matrix-F multiplier 829, an assembler 831, and a controller (not shown).

In this case, the controller stores a child parity check matrix in an internal memory included in the controller by way of example. The controller generates a final codeword vector using a parent parity check matrix corresponding to a code rate to be used in a signal transmission apparatus. The controller also generates a final codeword vector using a child parity check matrix corresponding to a code rate to be used in the signal transmission apparatus. Likewise, the controller generates a final codeword vector by puncturing a codeword vector generated using the parent parity check matrix corresponding to a code rate to be used in the signal transmission apparatus. That is, the controller controls the entire operation of the encoder 611 corresponding to a code rate to be used in the signal transmission apparatus.

Also, the controller determines a code rate to be used in the signal transmission apparatus when an information vector is input, and controls the operation of the encoder 611 corresponding to the determined code rate.

First, the operation of the encoder 611 described below relates to when the determined code rate is a code rate of the parent parity check matrix ("a parent code rate"). Herein, that the determined code rate is the parent code rate represents that a final codeword vector is generated using the parent parity check matrix.

If an information vector to be encoded is received, the information vector is delivered to the puncturer 811, the partial matrix-A multiplier 813, the partial matrix-C multiplier 815 and the switch 817. The partial matrix-A multiplier 813 multiplies the information vector by the partial matrix A, and outputs the result to the partial matrix-$ET^{-1}$ multiplier 819 and the XOR operator 825. The partial matrix-$ET^{-1}$ multiplier 819 multiplies the signal output from the partial matrix-A multiplier 813 by the partial matrix $ET^{-1}$, and outputs the result to the XOR operator 821. The partial matrix-C multiplier 815 multiplies the information vector by the partial matrix C, and outputs the result to the XOR operator 821. The XOR operator 821 performs an XOR operation on the signal output from the partial matrix-$ET^{-1}$ multiplier 819 and the signal output from the partial matrix-C multiplier 815, and outputs the result to the partial matrix-B multiplier 823 and the puncturer 811. The signal output from the XOR operator 821 is a first parity vector.

The partial matrix-B multiplier 823 multiplies the signal output from the XOR operator 821 by the partial matrix B, and outputs the result to the XOR operator 825. The XOR operator 825 performs an XOR operation on the signal output from the partial matrix-A multiplier 813 and the signal output from the partial matrix-B multiplier 823, and outputs the result to the partial matrix-$T^{-1}$ multiplier 827. The partial matrix-$T^{-1}$ multiplier 827 multiplies the signal output from the XOR operator 825 by the partial matrix $T^{-1}$, and outputs the result to the puncturer 811. The signal output from the partial matrix-$T^{-1}$ multiplier 827 is a second parity vector.

The switch 817 performs a switching operation under the control of the controller, and the controller switches on the switch 817 to input the information vector to the partial matrix-F multiplier 829 only when the information vector needs to generate a third parity vector. That is, the controller switches on the switch 817 to input the information vector to the partial matrix-F multiplier 829 only when the information vector needs to generate a final codeword vector using a child parity check matrix. But, the code rate to be used in the signal transmission apparatus is a parent code rate, the controller switches off the switch 817.

The puncturer 811, under the control of the controller, performs a puncturing operation. But, the code rate to be used in the signal transmission apparatus is a parent code rate, the controller controls the puncturer 811 not to perform a puncturing operation, and to bypass the first parity vector and the second parity vector to the assembler 831. The assembler 831, under the control of the controller, outputs a final codeword vector by assembling the information vector, the first parity vector and the second parity vector.

Second, the operation of the encoder 611 described below relates to when the determined code rate is a code rate of the child parity check matrix ("a child code rate"). Herein, that the determined code rate is the child code rate represents that a final codeword vector is generated using the child parity check matrix.

The difference between the operation of the encoder 611 when the final codeword vector is generated using the child parity check matrix and the operation of the encoder 611 when the final codeword vector is generated using the parent parity check matrix is that a final codeword vector includes a third parity vector. That is, the controller switches on the switch 817 to input the information vector to the partial matrix F multiplier 829 since the determined code rate is the child code rate.

The partial matrix F multiplier 829 generates a third parity vector by multiplying the information vector output from the switch 817 by the partial matrix F, and outputs the result to the assembler 831. The assembler 831, under the control of the controller, generates a final codeword vector by assembling the information vector, the first parity vector, the second parity vector and the third parity vector.

Third, the operation of the encoder 611 described below relates to when the determined code rate is greater than the parent code rate. Herein, the code rate greater than the parent code rate will be referred as "excess code rate". That is, a final codeword vector is generated puncturing a codeword vector generated using the parent parity check matrix when the determined code rate is the excess code rate.

The difference between the operation of the encoder 611 when the final codeword vector is generated using the parent parity check matrix and the operation of the encoder 611 when the final codeword vector is generated puncturing a codeword vector generated using the parent parity check matrix is that a final codeword vector is generated by puncturing at least one of the first parity vector and the second parity vector corresponding to the excess code rate.

That is, the puncturer 811, under the control of the controller, punctures at least one of the first parity vector and the second parity vector corresponding to the excess code rate since the determined code rate is the excess code rate. The puncturer 811 then outputs the result to the assembler 831. The assembler 831 in turn generates a final codeword vector by assembling the information vector and a signal output from the puncturer 811.

In FIG. 8, although the controller generates the information vector, the first parity vector, the second parity vector, and the third parity vector in parallel according to the code rate, and then assembles a final codeword vector using the generated vectors by way of example, the controller can sequentially generate only the corresponding vectors among the information vector, the first parity vector, the second parity vector, and the third parity vector according to the code rate, and then assemble a final codeword vector using the generated vectors.

In FIG. 8, the controller further determines a code rate to be used in the signal transmission apparatus when the information vector is inputted by way of example, the controller can control the operation of the encoder 611 corresponding to a predetermined code rate. The encoder 611 includes the puncturer 811 by way of example. However, the puncturer 811 does not perform a puncturing operation when a code rate to be used in the signal transmission apparatus is one of the parent code rate and the child code rate. Thus, the signal transmission apparatus uses one of the parent code rate and the child code rate, the encoder 611 doesn't include the puncturer 811.

All the LDPC-family codes can be decoded by a sum-product algorithm in a bipartite graph. A decoding scheme for the LDPC codes can be roughly classified into a bidirectional delivery scheme and a flow delivery scheme. In the bidirectional delivery scheme used for a decoding operation, because every check node has a node processor, complexity of the decoder increases with the number of the check nodes, but all nodes are simultaneously updated, contributing to a noticeable increase in the decoding speed.

Compared with the bidirectional delivery scheme, the flow delivery scheme having a single node processor, the node processor updates information of all nodes in the bipartite graph, contributing to a decrease in complexity of the decoder. As a size of the parity check matrix increases, i.e. as the number of nodes increases, the decoding speed decreases. If parity check matrixes are generated in units of blocks like the block LDPC code supporting a variable code rate disclosed in the present invention, as many node processors as the number of blocks constituting the parity check matrix are used for decoding, decreasing the complexity of the decoder and increasing the decoding speed as compared with the bidirectional delivery scheme.

Figure 9:
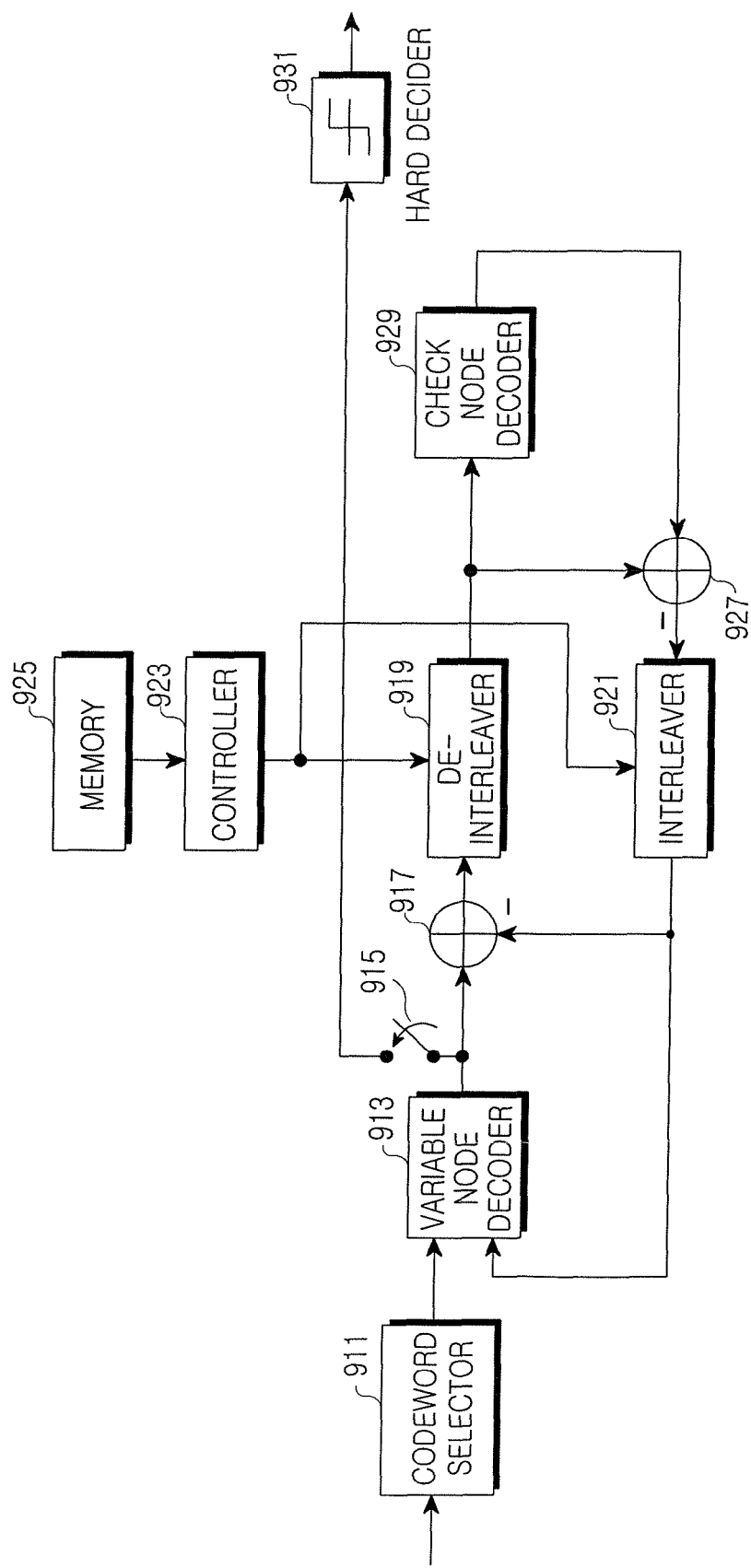
FIG. 9 is a diagram illustrating an internal structure of the decoder as illustrated in FIG. 7.

FIG. 9 is a block diagram illustrating an internal structure of the decoder 715 of illustrated in FIG. 7.

In FIG. 9, the decoder 715 includes a codeword selector 911, a variable node decoder 913, a switch 915, an XOR operator 917, a deinterleaver 919, an interleaver 921, a controller 923, a memory 925, an XOR operator 927, a check node decoder 929, and a hard decider 931.

The signal output from the demodulator 713 of FIG. 7 is delivered to the codeword selector 911 that selects a codeword according to a code rate used in the signal transmission apparatus, using the signal output from the demodulator 713. Herein, when the signal transmission apparatus uses an exceed code rate, the codeword selector 911 inserts '0' in the bits corresponding to the punctured parity bits and outputs the result to the variable node decoder 913. In addition, the codeword selector 911 previously stores the child parity check matrix predefined between the signal transmission apparatus and the signal reception apparatus, and also previously stores puncturing information of the parity bits corresponding to the exceed code rate used in the signal transmission apparatus. Herein, the codeword selector 911 previously stores not only the number of parity bits punctured according to the code rate, but also position information thereof The variable node decoder 913 calculates probable values of the signal output from the codeword selector 911, updates the calculated probable values and outputs the result to the switch 915 and the XOR operator 917. Herein, the variable node decoder 913 connects variable nodes according to the parity check matrix previously set in the decoder 715, and an update operation having as many input values and output values as the number of '1's connected to the variable nodes is performed. Herein, the decoder 715 uses one of the parent parity check matrix and the child parity check matrix, the variable node decoder 913 connects variable nodes according to one of the parent parity check matrix and the child parity check matrix. The number of '1's connected to the variable nodes is equal to a weight for each of columns constituting the parity check matrix. Therefore, an internal operation of the variable node decoder 913 differs according to the weight for each of the columns constituting the parity check matrix.

The XOR operator 917 subtracts the output signal of the interleaver 921 in the previous iterative decoding process from the output signal of the variable node decoder 913, and outputs the result to the deinterleaver 919. If the current decoding process is an initial decoding process, the output signal of the interleaver 921 should be regarded as '0'.

The deinterleaver 19 deinterleaves the signal output from the XOR operator 917 according to a preset deinterleaving scheme, and outputs the result to the XOR operator 927 and the check node decoder 929. Herein, the deinterleaver 919 has an internal structure corresponding to the parity check matrix, because an output value for the input value of the interleaver 921 corresponding to the deinterleaver 919 differs according to positions of the elements having a value of '1' in the parity check matrix.

The XOR operator 927 subtracts the output signal of the deinterleaver 919 from the output signal of the check node decoder 929 in the previous iterative decoding process, and outputs the result to the interleaver 921. The check node decoder 929 connects check nodes according to the parity check matrix previously set in the decoder 715, and an update operation having as many input values and output values as the number of '1's connected to the check nodes is performed. Herein, the decoder 715 uses one of the parent parity check matrix and the child parity check matrix, the check node decoder 929 connects check nodes according to one of the parent parity check matrix and the child parity check matrix. The number of '1's connected to the check nodes is equal to a weight for each of rows constituting the parity check matrix. Therefore, an internal operation of the check node decoder 929 differs according to the weight for each of the rows constituting the parity check matrix.

The interleaver 921, under the control of the controller 923, interleaves the signal output from the XOR operator 927 using a preset interleaving scheme, and outputs the result to the XOR operator 917 and the variable node decoder 913. The controller 923 reads interleaving scheme information stored in the memory 925, and controls the interleaving scheme of the interleaver 921. If the current decoding process is an initial decoding process, the output signal of the deinterleaver 919 should be regarded as '0'.

By iteratively performing the above processes, highly-reliable decoding is performed without error, and after an iterative decoding process corresponding to a preset iteration is performed, the switch 915 switches off between the variable node decoder 913 and the XOR operator 917, and switches on between the variable node decoder 913 and the hard decider 931 so that the output signal of the variable node decoder 913 is delivered to the hard decider 931. The hard decider 931 performs hard decision on the signal output from the variable node decoder 913, and outputs the hard decision value. The output value of the hard decider 931 is the finally decoded value.

In FIG. 9, the codeword selector 911 determines a code rate used in the signal transmission apparatus when the signal output from the demodulator 713 is inputted by way of example, the codeword selector 911 can perform a decoding operation corresponding to a predetermined code rate.

Figure 10:
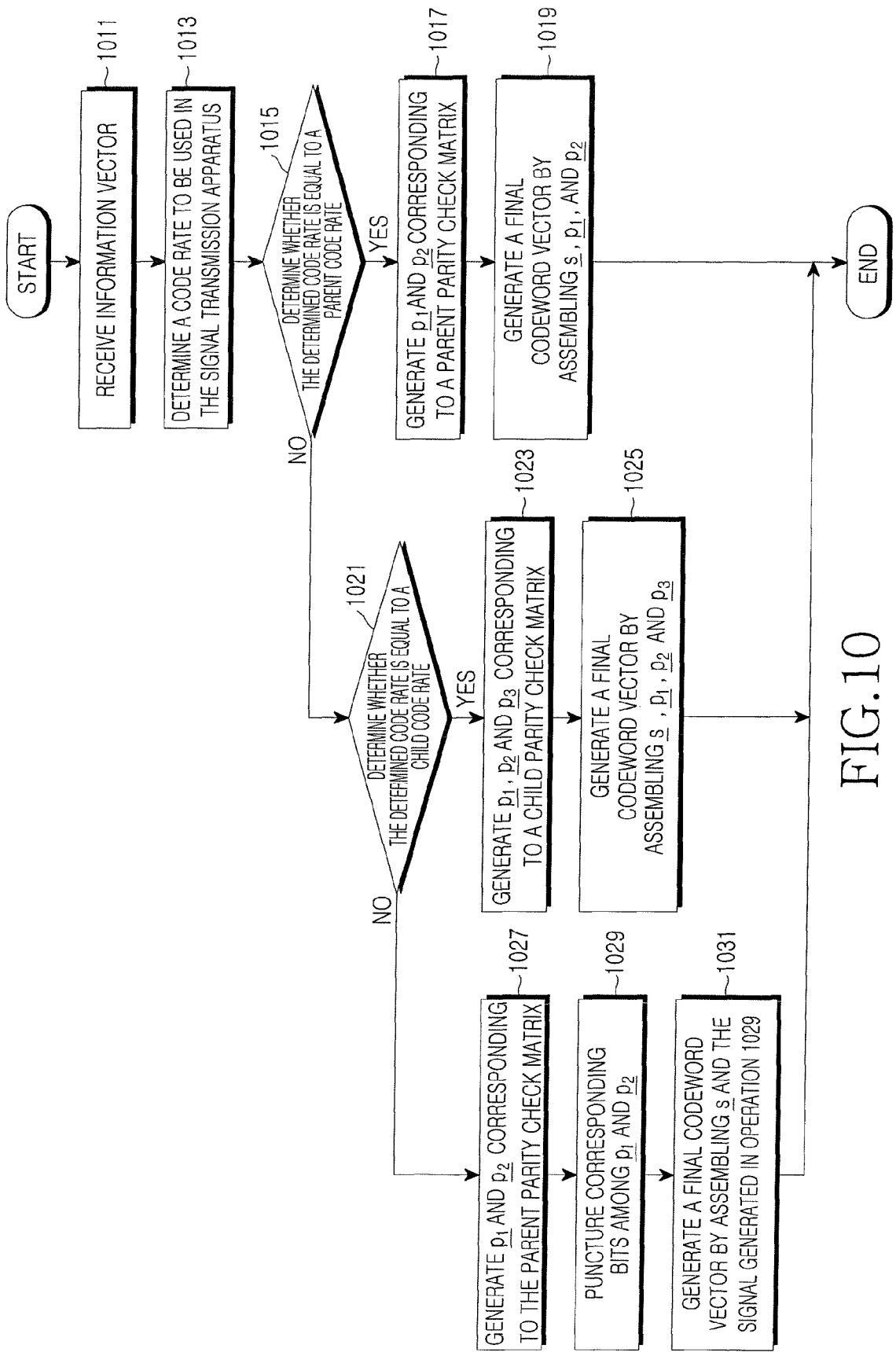
FIG. 10 is a flowchart illustrating an operating method of an encoder as illustrated in FIG. 6.

FIG. 10 is a flowchart illustrating an operating method of an encoder 611 as illustrated in FIG. 6.

In FIG. 10, in step 1011, the encoder 611 receives an information vector. In step 1013, the encoder 611 determines a code rate to be used in the signal transmission apparatus. In step 1015, the encoder 611 determines whether the determined code rate is equal to a parent code rate. If it is determined that the determined code rate is equal to the parent code rate, the encoder 611 proceeds to step 1017 where it generates a first parity vector and a second parity vector corresponding to a parent parity check matrix. In step 1019, the encoder 611 generates a final codeword vector by assembling the information vector, the first parity vector and the second parity vector.

However, if it is determined in step 1015 that the determined code rate is not equal to the parent code rate, the encoder 611 proceeds to step 1021 where it determines whether the determined code rate is equal to a child code rate. If it is determined that the determined code rate is equal to the child code rate, the encoder 611 proceeds to step 1023 where it generates a first parity vector, a second parity vector and a third parity vector corresponding to a child parity check matrix. In step 1025, the encoder 611 generates a final codeword vector by assembling the information vector, the first parity vector, the second parity vector and the third parity vector.

However, if it is determined in step 1021 that the determined code rate is not equal to the child code rate, the encoder 611 proceeds to step 1027 where it generates a first parity vector and a second parity vector corresponding to the parent parity check matrix. In step 1029, the encoder 611 punctures corresponding bits among the first parity vector and the second parity vector. In step 1031, the encoder 611 generates a final codeword vector by assembling the information vector and the signal generated in step 1029.

Otherwise, the parity check matrix, according to the present invention, illustrated in FIG. 1, each of the partial matrix B 121, the partial matrix E 133 and the partial matrix T 131 is generated as the same structure illustrated in FIG. 11 for minimizing an encoding complexity of a block LDPC code.

A transpose matrix of the partial matrix B illustrated in FIG. 1, the partial matrix E illustrated in FIG. 1, the partial matrix T illustrated in FIG. 1 and an inverse matrix of the partial matrix T illustrated in FIG. 1 is described below with reference to FIG. 10.

FIG. 11 is a diagram illustrating is a diagram of a transpose matrix of the partial matrix B illustrated in FIG. 1, the partial matrix E illustrated in FIG. 1, the partial matrix T illustrated in FIG. 1 and an inverse matrix of the partial matrix T illustrated in FIG. 1.

In FIG. 11, a matrix BT represents a transpose matrix of the partial matrix B 121, and a matrix $T^{-1}$ represents an inverse matrix of the partial matrix T 131. The partial matrix T 131 has a form similar to the form of the full lower triangular matrix. That is, an identity matrix is arranged in blocks located in diagonal of the partial matrix T 131, and a permutation matrix is arranged in blocks located in dual diagonal with the diagonal of the partial matrix T 131. Here, a matrix arranged in a block is referred as 'block matrix'.

Otherwise, the process of generating the matrix $B^T$, the partial matrix E, the partial matrix T, and the matrix $T^{-1}$ is described below.

Further, it is assumed that a structure of the parent parity check matrix is a structure illustrated in FIG. 12.

FIG. 12 is a diagram illustrating a parity check matrix having a form similar to the form of the full lower triangular matrix.

The parity check matrix illustrated in FIG. 12 is different from the parity check matrix having a form of the full lower triangular matrix in the form of the parity part. In FIG. 12, a superscript (or exponent) $a_{ij}$ of the permutation matrix P of an information part is either $0 \leq a_{ij} \leq N_s-1$ or $a_{ij}=\infty$, as described above. A permutation matrix P with a superscript $a_{ij}=0$, i.e. a permutation matrix $P^0$, of the information part represents an identity matrix $I_{N_s \times N_s}$, and a permutation matrix P with a superscript $a_{ij}=\infty$, i.e. a permutation matrix $P^\infty$, represents a zero matrix. In FIG. 7, 'p' represents the number of rows of blocks mapped to the information part, and 'q' represents the number of columns of blocks mapped to the parity part. Also, superscripts $a_i$, x and y of the permutation matrixes P mapped to the parity part represent exponents of the permutation matrix P. However, for the convenience of explanation, the different superscripts $a_i$, x and y are used to distinguish the parity part from the information part. That is, in FIG. 12, $P^{1_1}$ and $P^{a_m}$ are also permutation matrixes, and the superscripts $a_1$ to $a_m$ are sequentially indexed to matrixes located in a diagonal part of the parity part. In addition, $P^x$ and $P^y$ are also permutation matrixes, and for the convenience of explanation, they are indexed in a different way to distinguish the parity part from the information part.

When the parent parity check matrix includes an information part s, a first parity part $p_1$ and a second parity part $p_2$, a codeword vector c can be divided into an information word vector s, a first parity vector $p_1$ and a second parity vector $p_2$. In this case, a product of the parent parity check matrix and the codeword vector c can be expressed below as Equation (1) and Equation (2):

$$A s^T + B p_1^T + T p_2^T = 0 \quad (1)$$

$$(ET^{-1}A+C)s^T+(ET^{-1}B+D)p_1^T=0 \quad (2)$$

In Equation (1), T denotes a transpose operation, and in Equation (2), a part $p_1^T$ related to a first parity vector $p_1$ can be calculated by $$p_1^T = \phi^{-1}(ET^{-1}A+C)s^T (\phi \triangleq ET^{-1}B+D) \quad (3)$$

In Equation (3), because the encoding complexity of the non-binary LDPC code is in proportion to the square of a size of a matrix φ, the present invention sets the matrix φ used for calculating the first parity vector $p_1$ as an identity matrix I. By setting the matrix φ as an identity matrix I in this way, the encoding complexity of the non-binary LDPC code is minimized. With reference to FIG. 11, a description will now be made of a process of setting the matrix φ as an identity matrix I.

A permutation matrix $P^{a_1}$ will be fixed to an identity matrix I. In a partial block of the partial matrix $T^{-1}$ illustrated in connection with FIG. 11, a part $P^{k_1 \sim k_2}$ represents a product $$\prod_{i=k_1}^{k_2} P^{a_i} = P^{\sum_{i=k_1}^{k_2} a_i}$$

of a matrix $P^{k_1}$ to a matrix $P^{k_2}$.

Because a partial matrix E includes all zero matrixes except one matrix, a product of the partial matrix E and an inverse matrix $T^{-1}$ of the partial matrix T can be expressed as a product of the last row of the inverse matrix $T^{-1}$ of the partial matrix T and the last matrix of the partial matrix E, as shown in Equation (4):

$$ET^{-1}= \mathbf{P^{a_m}}_{[P^{2-m}} \triangleq P^{3-m} \triangleq \ldots \mathbf{P^{a_m}} \triangleq_I] \quad (4)$$

If the product of the partial matrix E and an inverse matrix $T^{-1}$ of the partial matrix T is multiplied by the partial matrix B, the result can be expressed as shown below in Equation (5):

$$ET^{-1}B=P^{a_m}P^{2-m}+P^{a_m}P^{k-m}P^y \quad (5)$$

where k is a particular natural number determined according to a position of $P^y$.

When the product of the partial matrix E and an inverse matrix $T^{-1}$ of the partial matrix T is multiplied by the partial matrix B as illustrated in Equation (5), because the partial matrix B includes all zero matrixes except two blocks, multiplication is performed on only the two blocks in the partial matrix B, thereby simplifying calculation.

If $D=P^x= \mathbf{P^a} P^{2-m}$ and $\mathbf{P^a}P^{k-m}P^y=I$, then $\phi \approx ET^{-1}B+D=I$. Therefore, the matrix $\phi$ becomes an identity matrix I. Equation (6) below briefly expresses the conditions that the matrix $\phi$ becomes an identity matrix I.

$$x \equiv a_m + \left(\sum_{i=2}^{m} a_i\right) \pmod{N_s}, \; a_m + \left(\sum_{i=k}^{m} a_i\right) + y \equiv 0 \pmod{N_s} \quad (6)$$

As described with reference to Equation (4) to Equation (6), if the matrix $\phi$ is set as an identity matrix I, a encoding process for the block LDPC code can be simplified in its complexity.

Figure 13:
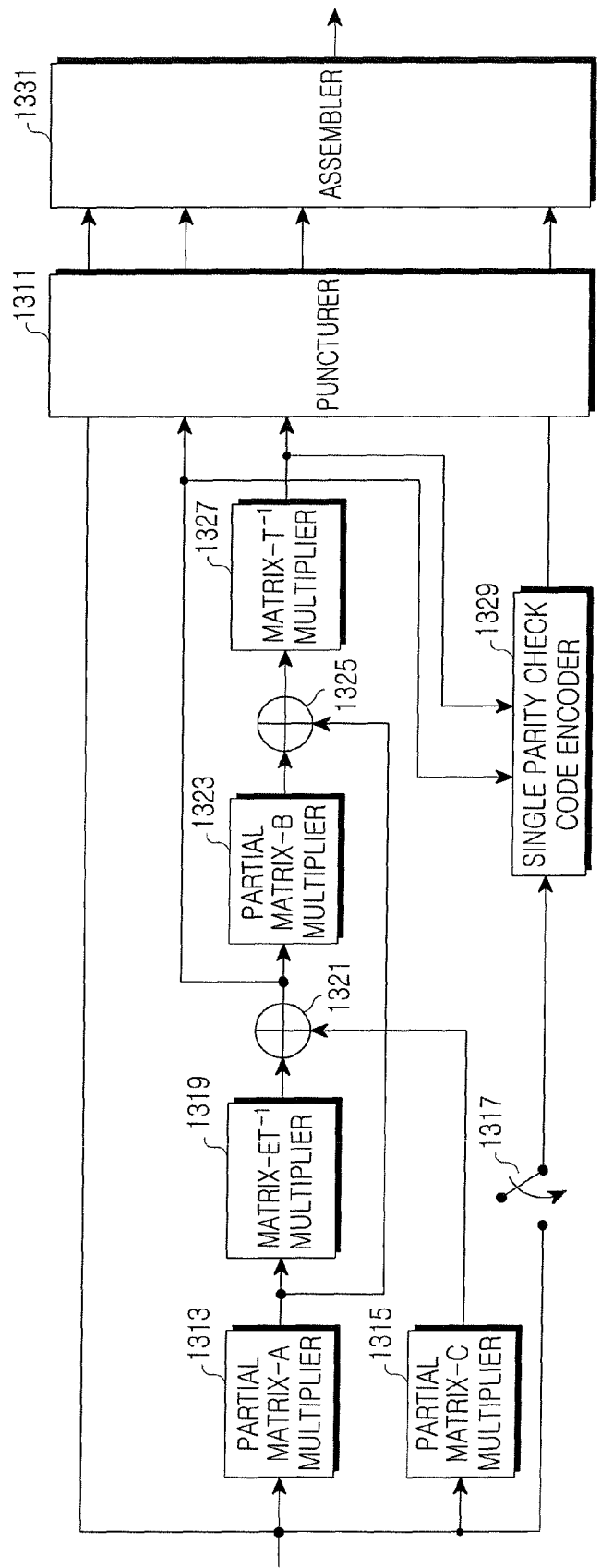
FIG. 13 is a diagram illustrating another internal structure of an encoder as illustrated in FIG. 6.

FIG. 13 is a diagram illustrating another internal structure of an encoder 611 as illustrated in FIG. 6.

In FIG. 13, the encoder 1311 includes a puncturer 1311, a partial matrix-A multiplier 1313, a partial matrix-C multiplier 1315, a switch 1317, a partial matrix-ET$^{-1}$ multiplier 1319, an XOR operator 1321, a partial matrix-B multiplier 1323, an XOR operator 1325, a partial matrix-T$^{-1}$ multiplier 827, a single parity check code encoder 1329, an assembler 1331 and a controller (not shown).

The controller stores a child parity check matrix in an internal memory included in the controller by way of example. The controller generates a final codeword vector using a parent parity check matrix corresponding to a code rate to be used in a signal transmission apparatus. The controller also generates a final codeword vector using a child parity check matrix corresponding to a code rate to be used in the signal transmission apparatus. The controller also generates a final codeword vector by puncturing a codeword vector generated using the parent parity check matrix corresponding to a code rate to be used in the signal transmission apparatus. That is, the controller controls a whole operation of the encoder 611 corresponding to a code rate to be used in the signal transmission apparatus.

The controller determines a code rate to be used in the signal transmission apparatus when an information vector is inputted, and controls an operation of the encoder 611 corresponding to the determined code rate.

First, the operation of the encoder 611 described below relates to when the determined code rate is the parent code rate. Herein, that the determined code rate is the parent code rate represents that a final codeword vector is generated using the parent parity check matrix.

If an information vector to be encoded is received, the information vector is delivered to the assembler 1331, the partial matrix-A multiplier 1313, the partial matrix-C multiplier 1315 and the switch 1317. The partial matrix-A multiplier 1313 multiplies the information vector by the partial matrix A, and outputs the result to the partial matrix-ET$^{-1}$ multiplier 1319 and the XOR operator 1325. The partial matrix-ET$^{-1}$ multiplier 1319 multiplies the signal output from the partial matrix-A multiplier 1313 by the partial matrix ET$^{-1}$, and outputs the result to the XOR operator 1321. The partial matrix-C multiplier 1315 multiplies the information vector by the partial matrix C, and outputs the result to the XOR operator 1321. The XOR operator 1321 performs an XOR operation on the signal output from the partial matrix-ET$^{-1}$ multiplier 1319 and the signal output from the partial matrix-C multiplier 1315, and outputs the result to the partial matrix-B multiplier 1323 and the puncturer 1311. The signal output from the XOR operator 1321 is a first parity vector.

The partial matrix-B multiplier 1323 multiplies the signal output from the XOR operator 1321 by the partial matrix B, and outputs the result to the XOR operator 1325. The XOR operator 1325 performs an XOR operation on the signal output from the partial matrix-A multiplier 1313 and the signal output from the partial matrix-B multiplier 1323, and outputs the result to the partial matrix-T$^{-1}$ multiplier 1327. The partial matrix-T$^{-1}$ multiplier 1327 multiplies the signal output from the XOR operator 1325 by the partial matrix T$^1$, and outputs the result to the puncturer 1311. The signal output from the partial matrix-T$^{-1}$ multiplier 1327 is a second parity vector.

The switch 1317 performs a switching operation under the control of the controller, and the controller switches on the switch 1317 to input the information vector to the single parity check code encoder 1329 only when the information vector needs to generate a third parity vector. That is, the controller switches on the switch 1317 to input the information vector to the single parity check code encoder 1329 only when the information vector needs to generate a final codeword vector using a child parity check matrix. But, the code rate to be used in the signal transmission apparatus is a parent code rate, the controller switches off the switch 1317.

The puncturer 1311, under the control of the controller, performs a puncturing operation. But, the code rate to be used in the signal transmission apparatus is a parent code rate, the controller controls the puncturer 1311 not to perform a puncturing operation, and to bypass the first parity vector and the second parity vector to the assembler 1331. The assembler 1331, under the control of the controller, outputs a final codeword vector by assembling the information vector, the first parity vector and the second parity vector.

Second, the operation of the encoder 611 described below relates to when the determined code rate is a code rate of the child parity check matrix ("a child code rate"). Herein, that the determined code rate is the child code rate represents that a final codeword vector is generated using the child parity check matrix.

Here, the difference between the operation of the encoder 611 when the final codeword vector is generated using the child parity check matrix and the operation of the encoder 611 when the final codeword vector is generated using the parent parity check matrix is that a final codeword vector includes a third parity vector. That is, the controller switches on the switch 1317 to input the information vector to the single parity check code encoder 1329 since the determined code rate is the child code rate.

The single parity check code encoder 1329 generates a single parity check code as a third parity vector by encoding the information vector output from the switch 1317, the first parity vector and the second parity vector, and outputs the result to the assembler 1331. The assembler 1331, under the control of the controller, generates a final codeword vector by assembling the information vector, the first parity vector, the second parity vector and the third parity vector.

Third, the operation of the encoder 611 described below relates to when the determined code rate is greater than the parent code rate. Herein, the code rate greater than the parent code rate will be referred as "excess code rate". That is, a final codeword vector is generated puncturing a codeword vector generated using the parent parity check matrix when the determined code rate is the excess code rate.

In this case, the difference between the operation of the encoder 611 when the final codeword vector is generated using the parent parity check matrix and the operation of the encoder 611 when the final codeword vector is generated puncturing a codeword vector generated using the parent parity check matrix is that a final codeword vector is generated by puncturing at least one of the first parity vector and the second parity vector corresponding to the excess code rate.

That is, the puncturer 1311, under the control of the controller, punctures at least one of the first parity vector and the second parity vector corresponding to the excess code rate since the determined code rate is the excess code rate. The puncturer 1311 then outputs the result to the assembler 831. The assembler 1331 generates a final codeword vector by assembling the information vector and a signal output from the puncturer 1311.

In FIG. 13, although the controller generates the information vector, the first parity vector, the second parity vector, and the third parity vector in parallel according to the code rate, and then assembles a final codeword vector using the generated vectors by way of example, the controller can sequentially generate only the corresponding vectors among the information vector, the first parity vector, the second parity vector, and the third parity vector according to the code rate, and then assemble a final codeword vector using the generated vectors.

In addition, in FIG. 13, the controller determines a code rate to be used in the signal transmission apparatus when the information vector is input by way of example, the controller can control the operation of the encoder 611 corresponding to a predetermined code rate. Here, the encoder 611 includes the puncturer 1311 by way of example. However, the puncturer 1311 does not perform a puncturing operation when a code rate to be used in the signal transmission apparatus is one of the parent code rate and the child code rate. So, the signal transmission apparatus uses one of the parent code rate and the child code rate, the encoder 611 does not include the puncturer 1311.

As can be understood from the foregoing description, the present invention enables transmission/reception of signals in a communication system using a block LDPC code supporting a variable code rate. In addition, the present invention generates a plurality of child parity check matrixes from one parent parity check matrix according to a code rate, thereby enabling signal transmission/reception at a variable code rate with minimized complexity.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method of generating a parity check matrix of a block Low Density Parity Check (LDPC) code by a signal transmission apparatus in a communication system, the method comprising:

generating, by the signal transmission apparatus, a first parity check matrix used for encoding an information vector as the block LDPC code, wherein the first parity check matrix is generated using a second parity check matrix, the second parity check matrix includes a plurality of blocks, the plurality of blocks are classified into blocks corresponding to an information part corresponding to the information vector, blocks corresponding to a first parity part corresponding to a first parity vector, and blocks corresponding to a second parity part corresponding to a second parity vector, wherein the blocks classified as the information part are classified into blocks corresponding to a first partial block and blocks corresponding to a second partial block, the blocks classified as the first parity part are classified into blocks corresponding to a third partial block and blocks corresponding to a fourth partial block, and the blocks classified as the second parity part are classified into blocks corresponding to a fifth partial block and blocks corresponding to a sixth partial block, wherein a code rate of the first parity check matrix as a second code rate is less than a code rate of the second parity check matrix as a first code rate, wherein the first parity check matrix includes the second parity check matrix and blocks corresponding to a third parity part corresponding to a third parity vector, the blocks classified as the third parity part are classified into blocks corresponding to a seventh partial block, blocks corresponding to an eighth partial block, blocks corresponding to a ninth partial block, blocks corresponding to a tenth partial block, blocks corresponding to an eleventh partial block and blocks corresponding to a twelfth partial block, and wherein the tenth partial block is diagonal with the sixth partial block block-by-block, identity matrixes are arranged in blocks corresponding to the tenth partial block.

2. The method of claim 1, wherein zero matrixes are arranged in blocks corresponding to the eighth partial block, blocks corresponding to the ninth partial block, blocks corresponding to the eleventh partial block, and blocks corresponding to the twelfth partial block.

3. The method of claim 1, wherein non-zero matrixes are arranged in blocks corresponding to the eighth partial block, blocks corresponding to the ninth partial block, blocks corresponding to the eleventh partial block, and blocks corresponding to the twelfth partial block.

4. A method of encoding a block Low Density Parity Check (LDPC) code by a signal transmission apparatus in a communication system, the method comprising:

generating, by the signal transmission apparatus, a block LDPC codeword by encoding an information vector using a second parity check matrix when a code rate to be used in the signal transmission apparatus is a second code rate less than a code rate of a first parity check matrix as a first code rate, wherein the second parity check matrix is generated using the first parity check matrix, the first parity check matrix includes a plurality of blocks, the plurality of blocks are classified into blocks corresponding to an information part corresponding to the information vector, blocks corresponding to a first parity part corresponding to a first parity vector, and blocks corresponding to a second parity part corresponding to a second parity vector, wherein the blocks classified as the information part are classified into blocks corresponding to a first partial block and blocks corresponding to a second partial block, the blocks classified as the first parity part are classified into blocks corresponding to a third partial block and blocks corresponding to a fourth partial block, and the blocks classified as the second parity part are classified into blocks corresponding to a fifth partial block and blocks corresponding to a sixth partial block, wherein the second parity check matrix includes the first parity check matrix and blocks corresponding to a third parity part corresponding to a third parity vector, the blocks classified as the third parity part are classified into blocks corresponding to a seventh partial block, blocks corresponding to an eighth partial block, blocks corresponding to a ninth partial block, blocks corresponding to a tenth partial block, blocks corresponding to an eleventh partial block and blocks corresponding to a twelfth partial block, and wherein the tenth partial block is diagonal with the sixth partial block block-by-block, identity matrixes are arranged in blocks corresponding to the tenth partial block.

5. The method of claim 4, wherein zero matrixes are arranged in blocks corresponding to the eighth partial block, blocks corresponding to the ninth partial block, blocks corresponding to the eleventh partial block, and blocks corresponding to the twelfth partial block.

6. The method of claim 4, wherein non-zero matrixes are arranged in blocks corresponding to the eighth partial block, blocks corresponding to the ninth partial block, blocks corresponding to the eleventh partial block, and blocks corresponding to the twelfth partial block.

7. The method of claim 4, wherein generating the block LDPC codeword by encoding the information vector using the second parity check matrix comprises:

generating a first signal by multiplying the information vector by a first partial matrix corresponding to the first partial block;

generating a second signal by multiplying the information vector by a second partial matrix corresponding to the second partial block;

generating a third signal by multiplying the first signal by a matrix product of a sixth partial matrix corresponding to the sixth partial block and an inverse matrix of a fifth partial matrix corresponding to the fifth partial block;

generating a fourth signal by adding the second signal and the third signal;

generating a fifth signal by multiplying the fourth signal by a third partial matrix corresponding to the third partial block;

generating a sixth signal by adding the first signal and the fifth signal;

generating a seventh signal by multiplying the sixth signal by the inverse matrix of the fifth partial matrix;

generating an eighth signal by multiplying a seventh partial matrix corresponding to the seventh partial block by the information vector; and assembling the information vector, the fourth signal as the first parity vector, the seventh signal as the second parity vector, and the eighth signal as the third parity vector, according to a format of the block LDPC code.

8. A method of encoding a block Low Density Parity Check (LDPC) code by a signal transmission apparatus in a communication system, the method comprising:

generating by the signal transmission apparatus, a first parity vector, a second parity vector, and a third parity vector by encoding an information vector using a second parity check matrix when a code rate to be used in the signal transmission apparatus is a second code rate greater than a code rate of a first parity check matrix as a first code rate, wherein a code rate of the second parity check matrix is a third code rate less than the first code rate; and generating a block LDPC codeword by puncturing at least one of the information vector, the first parity vector, the second parity vector, and the third parity vector, corresponding to the second code rate, wherein the second parity check matrix is generated using the first parity check matrix, the first parity check matrix includes a plurality of blocks, the plurality of blocks are classified into blocks corresponding to an information part corresponding to the information vector, blocks corresponding to a first parity part corresponding to the first parity vector, and blocks corresponding to a second parity part corresponding to the second parity vector, wherein the blocks classified as the information part are classified into blocks corresponding to a first partial block and blocks corresponding to a second partial block, the blocks classified as the first parity part are classified into blocks corresponding to a third partial block and blocks corresponding to a fourth partial block, and the blocks classified as the second parity part are classified into blocks corresponding to a fifth partial block and blocks corresponding to a sixth partial block, wherein the second parity check matrix includes the first parity check matrix and blocks corresponding to a third parity part corresponding to the third parity vector, the blocks classified as the third parity part are classified into blocks corresponding to a seventh partial block, blocks corresponding to an eighth partial block, blocks corresponding to a ninth partial block, blocks corresponding to a tenth partial block, blocks corresponding to an eleventh partial block and blocks corresponding to a twelfth partial block, and wherein the tenth partial block is diagonal with the sixth partial block block-by-block, identity matrixes are arranged in blocks corresponding to the tenth partial block.

9. The method of claim 8, wherein zero matrixes are arranged in blocks corresponding to the eighth partial block, blocks corresponding to the ninth partial block, blocks corresponding to the eleventh partial block, and blocks corresponding to the twelfth partial block.

10. The method of claim 8, wherein non-zero matrixes are arranged in blocks corresponding to the eighth partial block, blocks corresponding to the ninth partial block, blocks corresponding to the eleventh partial block, and blocks corresponding to the twelfth partial block.

11. The method of claim 8, wherein generating the block LDPC codeword by encoding the information vector using the second parity check matrix comprises:

generating a first signal by multiplying the information vector by a first partial matrix corresponding to the first partial block;

generating a second signal by multiplying the information vector by a second partial matrix corresponding to the second partial block;

generating a third signal by multiplying the first signal by a matrix product of a sixth partial matrix corresponding to the sixth partial block and an inverse matrix of a fifth partial matrix corresponding to the fifth partial block;

generating a fourth signal by adding the second signal and the third signal;

generating a fifth signal by multiplying the fourth signal by a third partial matrix corresponding to the third partial block;

generating a sixth signal by adding the first signal and the fifth signal;

generating a seventh signal by multiplying the sixth signal by the inverse matrix of the fifth partial matrix; and generating a single parity codeword by using the information vector, the fourth signal, and the seventh signal.

12. A signal transmission apparatus for encoding a block Low Density Parity Check (LDPC) code in a communication system, the signal transmission apparatus comprising:

an encoder for generating a block LDPC codeword by encoding an information vector using a second parity check matrix when a code rate to be used in the signal transmission apparatus is a second code rate less than a code rate of a first parity check matrix as a first code rate, wherein the second parity check matrix is generated using the first parity check matrix, the first parity check matrix includes a plurality of blocks, the plurality of blocks are classified into blocks corresponding to an information part corresponding to the information vector, blocks corresponding to a first parity part corresponding to a first parity vector, and blocks corresponding to a second parity part corresponding to a second parity vector, wherein the blocks classified as the information part are classified into blocks corresponding to a first partial block and blocks corresponding to a second partial block, the blocks classified as the first parity part are classified into blocks corresponding to a third partial block and blocks corresponding to a fourth partial block, and the blocks classified as the second parity part are classified into blocks corresponding to a fifth partial block and blocks corresponding to a sixth partial block, wherein the second parity check matrix includes the first parity check matrix and blocks corresponding to a third parity part corresponding to a third parity vector, the blocks classified as the third parity part are classified into blocks corresponding to a seventh partial block, blocks corresponding to an eighth partial block, blocks corresponding to a ninth partial block, blocks corresponding to a tenth partial block, blocks corresponding to an eleventh partial block and blocks corresponding to a twelfth partial block, and wherein the tenth partial block is diagonal with the sixth partial block block-by-block, identity matrixes are arranged in blocks corresponding to the tenth partial block.

13. The signal transmission apparatus of claim 12, wherein zero matrixes are arranged in blocks corresponding to the eighth partial block, blocks corresponding to the ninth partial block, blocks corresponding to the eleventh partial block, and blocks corresponding to the twelfth partial block.

14. The signal transmission apparatus of claim 12, wherein non-zero matrixes are arranged in blocks corresponding to the eighth partial block, blocks corresponding to the ninth partial block, blocks corresponding to the eleventh partial block, and blocks corresponding to the twelfth partial block.

15. The signal transmission apparatus of claim 12, wherein the encoder comprises:
a first multiplier for generating a first signal by multiplying the information vector by a first partial matrix corresponding to the first partial block;
a second multiplier for generating a second signal by multiplying the information vector by a second partial matrix corresponding to the second partial block;
a third multiplier for generating a third signal by multiplying the first signal by a matrix product of a sixth partial matrix corresponding to the sixth partial block and an inverse matrix of a fifth partial matrix corresponding to the fifth partial block;
a first adder for generating a fourth signal by adding the second signal and the third signal;
a fourth multiplier for generating a fifth signal by multiplying the fourth signal by a third partial matrix corresponding to the third partial block;
a second adder for generating a sixth signal by adding the first signal and the fifth signal;
a fifth multiplier for generating a seventh signal by multiplying the sixth signal by the inverse matrix of the fifth partial matrix;

a sixth multiplier for generating an eighth signal by multiplying a seventh partial matrix corresponding to the seventh partial block by the information vector; and
an assembler for assembling the information vector, the fourth signal as the first parity vector, the seventh signal as the second parity vector, and the eighth signal as the third parity vector, according to a format of the block LDPC code.

16. A signal transmission apparatus for encoding a block Low Density Parity Check (LDPC) code in a communication system, the signal transmission apparatus comprising:
an encoder for generating a first parity vector, a second parity vector, and a third parity vector by encoding an information vector using a second parity check matrix when a code rate to be used in the signal transmission apparatus is a second code rate greater than a code rate of a first parity check matrix as a first code rate, wherein a code rate of the second parity check matrix is a third code rate less than the first code rate, and generating a block LDPC codeword by puncturing at least one of the information vector, the first parity vector, the second parity vector, and the third parity vector, corresponding to the second code rate, wherein the second parity check matrix is generated using the first parity check matrix, the first parity check matrix includes a plurality of blocks, the plurality of blocks are classified into blocks corresponding to an information part corresponding to the information vector, blocks corresponding to a first parity part corresponding to a first parity vector, and blocks corresponding to a second parity part corresponding to a second parity vector, wherein the blocks classified as the information part are classified into blocks corresponding to a first partial block and blocks corresponding to a second partial block, the blocks classified as the first parity part are classified into blocks corresponding to a third partial block and blocks corresponding to a fourth partial block, and the blocks classified as the second parity part are classified into blocks corresponding to a fifth partial block and blocks corresponding to a sixth partial block, wherein the second parity check matrix includes the first parity check matrix and blocks corresponding to a third parity part corresponding to a third parity vector, the blocks classified as the third parity part are classified into blocks corresponding to a seventh partial block, blocks corresponding to an eighth partial block, blocks corresponding to a ninth partial block, blocks corresponding to a tenth partial block, blocks corresponding to an eleventh partial block and blocks corresponding to a twelfth partial block, and wherein the tenth partial block is diagonal with the sixth partial block block-by-block, identity matrixes are arranged in blocks corresponding to the tenth partial block.

17. The signal transmission apparatus of claim 16, wherein zero matrixes are arranged in blocks corresponding to the eighth partial block, blocks corresponding to the ninth partial block, blocks corresponding to the eleventh partial block, and blocks corresponding to the twelfth partial block.

18. The signal transmission apparatus of claim 16, wherein non-zero matrixes are arranged in blocks corresponding to the eighth partial block, blocks corresponding to the ninth partial block, blocks corresponding to the eleventh partial block, and blocks corresponding to the twelfth partial block.

19. The signal transmission apparatus of claim 16, wherein the encoder comprises:

a first multiplier for generating a first signal by multiplying the information vector by a first partial matrix corresponding to the first partial block;
a second multiplier for generating a second signal by multiplying the information vector by a second partial matrix corresponding to the second partial block;
a third multiplier for generating a third signal by multiplying the first signal by a matrix product of a sixth partial matrix corresponding to the sixth partial block and an inverse matrix of a fifth partial matrix corresponding to the fifth partial block;
a first adder for generating a fourth signal by adding the second signal and the third signal;
a fourth multiplier for generating a fifth signal by multiplying the fourth signal by a third partial matrix corresponding to the third partial block;
a second adder for generating a sixth signal by adding the first signal and the fifth signal;
a fifth multiplier for generating a seventh signal by multiplying the sixth signal by the inverse matrix of the fifth partial matrix; and
a single parity encoder for generating a single parity codeword by using the information vector, the fourth signal, and the seventh signal.

20. The signal transmission apparatus of claim 19, wherein the encoder comprises:
a puncturer for puncturing at least one of the information vector, the first parity vector, the second parity vector, and the third parity vector, corresponding to the second code rate.

21. A method of decoding a block low density parity check (LDPC) code by a signal reception apparatus in a communication system, the method comprising:
detecting, by the signal reception apparatus, an information vector by decoding a reception signal using a second parity check matrix when a code rate used in the signal transmission apparatus is a second code rate less than a code rate of a first parity check matrix as a first code rate,
wherein the second parity check matrix is generated using a first parity check matrix, the first parity check matrix includes a plurality of blocks, the plurality of blocks are classified into blocks corresponding to an information part corresponding to the information vector, blocks corresponding to a first parity part corresponding to a first parity vector, and blocks corresponding to a second parity part corresponding to a second parity vector,
wherein the blocks classified as the information part are classified into blocks corresponding to a first partial block and blocks corresponding to a second partial block, the blocks classified as the first parity part are classified into blocks corresponding to a third partial block and blocks corresponding to a fourth partial block, and the blocks classified as the second parity part are classified into blocks corresponding to a fifth partial block and blocks corresponding to a sixth partial block,
wherein the second parity check matrix includes the first parity check matrix and blocks corresponding to a third parity part corresponding to a third parity vector, the blocks classified as the third parity part are classified into blocks corresponding to a seventh partial block, blocks corresponding to an eighth partial block, blocks corresponding to a ninth partial block, blocks corresponding to a tenth partial block, blocks corresponding to an eleventh partial block and blocks corresponding to a twelfth partial block, and
wherein the tenth partial block is diagonal with the sixth partial block block-by-block, identity matrixes are arranged in blocks corresponding to the tenth partial block.

22. The method of claim 21, wherein zero matrixes are arranged in blocks corresponding to the eighth partial block, blocks corresponding to the ninth partial block, blocks corresponding to the eleventh partial block, and blocks corresponding to the twelfth partial block.

23. The method of claim 21, wherein non-zero matrixes are arranged in blocks corresponding to the eighth partial block, blocks corresponding to the ninth partial block, blocks corresponding to the eleventh partial block, and blocks corresponding to the twelfth partial block.

24. The method of claim 21, wherein detecting the information vector by decoding the reception signal using the second parity check matrix comprises:
determining a deinterleaving scheme and an interleaving scheme according to the second parity check matrix;
detecting probability values of the reception signal;
generating a first signal by subtracting a signal generated in a previous decoding process from the probability values of the reception signal;
deinterleaving the first signal using the deinterleaving scheme;
detecting probability values from the deinterleaved signal;
generating a second signal by subtracting the deinterleaved signal from the probability values of the deinterleaved signal; and
interleaving the second signal using the interleaving scheme and iterative-decoding the interleaved signal.

25. A method of decoding a block low density parity check (LDPC) code by a signal reception apparatus in a communication system, the method comprising:
generating, by the signal reception apparatus, a decoded signal by inserting zero into a predetermined position of a reception signal when a code rate used in the signal transmission apparatus is a second code rate greater than a code rate of a first parity check matrix as a first code rate, wherein a code rate of decoded signal is a third code rate less than the first code rate; and
detecting an information vector by decoding the decoded signal using a second parity check matrix having the third code rate,
wherein the second parity check matrix is generated using the first parity check matrix, the first parity check matrix includes a plurality of blocks, the plurality of blocks are classified into blocks corresponding to an information part corresponding to the information vector, blocks corresponding to a first parity part corresponding to a first parity vector, and blocks corresponding to a second parity part corresponding to a second parity vector,
wherein the blocks classified as the information part are classified into blocks corresponding to a first partial block and blocks corresponding to a second partial block, the blocks classified as the first parity part are classified into blocks corresponding to a third partial block and blocks corresponding to a fourth partial block, and the blocks classified as the second parity part are classified into blocks corresponding to a fifth partial block and blocks corresponding to a sixth partial block,
wherein the second parity check matrix includes the first parity check matrix and blocks corresponding to a third parity part corresponding to a third parity vector, the blocks classified as the third parity part are classified into blocks corresponding to a seventh partial block, blocks corresponding to an eighth partial block, blocks corresponding to a ninth partial block, blocks corresponding to a tenth partial block, blocks corresponding to an eleventh partial block and blocks corresponding to a twelfth partial block, and wherein the tenth partial block is diagonal with the sixth partial block block-by-block, identity matrixes are arranged in blocks corresponding to the tenth partial block.

26. The method of claim 25, wherein zero matrixes are arranged in blocks corresponding to the eighth partial block, blocks corresponding to the ninth partial block, blocks corresponding to the eleventh partial block, and blocks corresponding to the twelfth partial block.

27. The method of claim 25, wherein non-zero matrixes are arranged in blocks corresponding to the eighth partial block, blocks corresponding to the ninth partial block, blocks corresponding to the eleventh partial block, and blocks corresponding to the twelfth partial block.

28. The method of claim 25, wherein detecting the information vector by decoding the decoded signal using the second parity check matrix comprises:
   determining a deinterleaving scheme and an interleaving scheme according to the second parity check matrix;
   detecting probability values of the reception signal;
   generating a first signal by subtracting a signal generated in a previous decoding process from the probability values of the reception signal;
   deinterleaving the first signal using the deinterleaving scheme;
   detecting probability values from the deinterleaved signal;
   generating a second signal by subtracting the deinterleaved signal from the probability values of the deinterleaved signal; and
   interleaving the second signal using the interleaving scheme and iterative-decoding the interleaved signal.

29. A signal reception apparatus for decoding a block Low Density Parity Check (LDPC) code in a communication system, the apparatus comprising:
   a decoder for detecting an information vector by decoding a reception signal using a second parity check matrix when a code rate used in the signal transmission apparatus is a second code rate less than a code rate of a first parity check matrix as a first code rate,
   wherein the second parity check matrix is generated using the first parity check matrix, the first parity check matrix includes a plurality of blocks, the plurality of blocks are classified into blocks corresponding to an information part corresponding to the information vector, blocks corresponding to a first parity part corresponding to a first parity vector, and blocks corresponding to a second parity part corresponding to a second parity vector,
   wherein the blocks classified as the information part are classified into blocks corresponding to a first partial block and blocks corresponding to a second partial block, the blocks classified as the first parity part are classified into blocks corresponding to a third partial block and blocks corresponding to a fourth partial block, and the blocks classified as the second parity part are classified into blocks corresponding to a fifth partial block and blocks corresponding to a sixth partial block,
   wherein the second parity check matrix includes the first parity check matrix and blocks corresponding to a third parity part corresponding to a third parity vector, the blocks classified as the third parity part are classified into blocks corresponding to a seventh partial block, blocks corresponding to an eighth partial block, blocks corresponding to a ninth partial block, blocks corresponding to a tenth partial block, blocks corresponding to an eleventh partial block and blocks corresponding to a twelfth partial block, and
   wherein the tenth partial block is diagonal with the sixth partial block block-by-block, identity matrixes are arranged in blocks corresponding to the tenth partial block.

30. The signal reception apparatus of claim 29, wherein zero matrixes are arranged in blocks corresponding to the eighth partial block, blocks corresponding to the ninth partial block, blocks corresponding to the eleventh partial block, and blocks corresponding to the twelfth partial block.

31. The signal reception apparatus of claim 29, wherein non-zero matrixes are arranged in blocks corresponding to the eighth partial block, blocks corresponding to the ninth partial block, blocks corresponding to the eleventh partial block, and blocks corresponding to the twelfth partial block.

32. The signal reception apparatus of claim 29, wherein the decoder comprises:
   a variable node decoder for connecting variable nodes according to a weight of each column of the second parity check matrix, according to a predetermined control signal, and detecting probability values of the reception signal;
   a first adder for subtracting a signal generated in a previous decoding process from a signal output from the variable node decoder in a present decoding process;
   a deinterleaver for deinterleaving a signal output from the first adder using a deinterleaving scheme set according to the second parity check matrix;
   a check node decoder for connecting check nodes according to a weight of each row of the second parity check matrix and detecting probability values of a signal output from the deinterleaver according to a predetermined control signal;
   a second adder for subtracting a signal output from the deinterleaver from a signal output from the check node decoder;
   an interleaver for interleaving a signal output from the second adder using an interleaving scheme set according to the second parity check matrix, and outputting the interleaved signal to the variable node decoder and the first adder; and
   a controller for determining the deinterleaving scheme and the interleaving scheme according to the second parity check matrix.

33. A signal reception apparatus for decoding a block Low Density Parity Check (LDPC) code in a communication system, the apparatus comprising:
   a decoder for generating a decoded signal by inserting zero into a predetermined position of a reception signal when a code rate used in the signal transmission apparatus is a second code rate greater than a code rate of a first parity check matrix as a first code rate, wherein a code rate of decoded signal is a third code rate less than the first code rate, and detecting an information vector by decoding the decoded signal using a second parity check matrix having the third code rate,
   wherein the second parity check matrix is generated using the first parity check matrix, the first parity check matrix includes a plurality of blocks, the plurality of blocks are classified into blocks corresponding to an information part corresponding to the information vector, blocks corresponding to a first parity part corresponding to a first parity vector, and blocks corresponding to a second parity part corresponding to a second parity vector, wherein the blocks classified as the information part are classified into blocks corresponding to a first partial block and blocks corresponding to a second partial block, the blocks classified as the first parity part are classified into blocks corresponding to a third partial block and blocks corresponding to a fourth partial block, and the blocks classified as the second parity part are classified into blocks corresponding to a fifth partial block and blocks corresponding to a sixth partial block, wherein the second parity check matrix includes the first parity check matrix and blocks corresponding to a third parity part corresponding to a third parity vector, the blocks classified as the third parity part are classified into blocks corresponding to a seventh partial block, blocks corresponding to an eighth partial block, blocks corresponding to a ninth partial block, blocks corresponding to a tenth partial block, blocks corresponding to an eleventh partial block and blocks corresponding to a twelfth partial block, and wherein the tenth partial block is diagonal with the sixth partial block block-by-block, identity matrixes are arranged in blocks corresponding to the tenth partial block.

34. The signal reception apparatus of claim 33, wherein zero matrixes are arranged in blocks corresponding to the eighth partial block, blocks corresponding to the ninth partial block, blocks corresponding to the eleventh partial block, and blocks corresponding to the twelfth partial block.

35. The signal reception apparatus of claim 33, wherein non-zero matrixes are arranged in blocks corresponding to the eighth partial block, blocks corresponding to the ninth partial block, blocks corresponding to the eleventh partial block, and blocks corresponding to the twelfth partial block.

36. The signal reception apparatus of claim 33, wherein the decoder comprises:
- a variable node decoder for connecting variable nodes according to a weight of each column of the second parity check matrix, according to a predetermined control signal, and detecting probability values of the decoded signal;
- a first adder for subtracting a signal generated in a previous decoding process from a signal output from the variable node decoder in a present decoding process;
- a deinterleaver for deinterleaving a signal output from the first adder using a deinterleaving scheme set according to the second parity check matrix;
- a check node decoder for connecting check nodes according to a weight of each row of the second parity check matrix and detecting probability values of a signal output from the deinterleaver according to a predetermined control signal;
- a second adder for subtracting a signal output from the deinterleaver from a signal output from the check node decoder;
- an interleaver for interleaving a signal output from the second adder using an interleaving scheme set according to the second parity check matrix, and outputting the interleaved signal to the variable node decoder and the first adder; and
- a controller for determining the deinterleaving scheme and the interleaving scheme according to the second parity check matrix.

* * * * *